(12) United States Patent
Severson et al.

(10) Patent No.: US 11,226,374 B2
(45) Date of Patent: Jan. 18, 2022

(54) DATA-DRIVEN MODEL FOR LITHIUM-ION BATTERY CAPACITY FADE AND LIFETIME PREDICTION

(71) Applicants: The Board of Trustees of the Leland Stanford Junior University, Stanford, CA (US); Massachusetts Institute of Technology, Cambridge, MA (US)

(72) Inventors: Kristen Ann Severson, Cambridge, MA (US); Richard Dean Braatz, Arlington, MA (US); William C. Chueh, Menlo Park, CA (US); Peter M. Attia, Stanford, CA (US); Norman Jin, Palo Alto, CA (US); Stephen J. Harris, Walnut Creek, CA (US); Nicholas Perkins, San Francisco, CA (US)

(73) Assignees: The Board of Trustees of the Leland Stanford Junior University, Stanford, CA (US); Massachusetts Institute of Technology, Cambridge, MA (US)

(*) Notice: Subject to any disclaimer, the term of this patent is extended or adjusted under 35 U.S.C. 154(b) by 531 days.

(21) Appl. No.: 16/161,852

(22) Filed: Oct. 16, 2018

(65) Prior Publication Data
US 2019/0113577 A1   Apr. 18, 2019

Related U.S. Application Data

(60) Provisional application No. 62/573,565, filed on Oct. 17, 2017.

(51) Int. Cl.
*G01R 31/3842* (2019.01)
*G01R 31/36* (2020.01)
(Continued)

(52) U.S. Cl.
CPC ..... *G01R 31/3842* (2019.01); *G01R 31/3648* (2013.01); *H01M 10/0525* (2013.01); *H01M 10/44* (2013.01); *H01M 10/48* (2013.01)

(58) Field of Classification Search
CPC ............ G01R 31/3842; G01R 31/3648; G01R 31/392; G01R 31/3624; G01R 31/3658;
(Continued)

(56) References Cited

U.S. PATENT DOCUMENTS

| 8,531,158 B2 | 9/2013 | Wang et al. |
| 9,018,916 B2 | 4/2015 | Iriyama et al. |

(Continued)

FOREIGN PATENT DOCUMENTS

| CN | 104950260 A | * | 9/2015 | ......... G01R 31/3648 |
| EP | 2762908 A1 | * | 8/2014 | ........... G01R 31/396 |

(Continued)

OTHER PUBLICATIONS

KR-20170136080—English Translation (Year: 2017).*
(Continued)

*Primary Examiner* — Natalie Huls
*Assistant Examiner* — Michael J Singletary
(74) *Attorney, Agent, or Firm* — Lumen Patent Firm

(57) ABSTRACT

A method of using data-driven predictive modeling to predict and classify battery cells by lifetime is provided that includes collecting a training dataset by cycling battery cells between a voltage V1 and a voltage V2, continuously measuring battery cell voltage, current, can temperature, and internal resistance during cycling, generating a discharge voltage curve for each cell that is dependent on a discharge capacity for a given cycle, calculating, using data from the discharge voltage curve, a cycle-to-cycle evolution of cell charge to output a cell voltage versus charge curve Q(V), generating transformations of ΔQ(V), generating transfor-
(Continued)

mations of data streams that include capacity, temperature and internal resistance, applying a machine learning model to determine a combination of a subset of the transformations to predict cell operation characteristics, and applying the machine learning model to output the predicted battery operation characteristics.

7 Claims, 22 Drawing Sheets

(51) Int. Cl.
*H01M 10/44* (2006.01)
*H01M 10/48* (2006.01)
*H01M 10/0525* (2010.01)

(58) Field of Classification Search
CPC ........... G01R 31/3662; G01R 31/3679; H01M 10/44; H01M 10/48; H01M 10/0525; Y02E 60/10
See application file for complete search history.

(56) References Cited

U.S. PATENT DOCUMENTS

| | | | |
|---|---|---|---|
| 2016/0041231 A1* | 2/2016 | Lee | G01R 31/382 702/63 |
| 2017/0115355 A1* | 4/2017 | Willard | G01R 31/392 |
| 2017/0205469 A1* | 7/2017 | Song | G01R 31/367 |
| 2018/0095140 A1* | 4/2018 | Park | G01R 31/378 |

FOREIGN PATENT DOCUMENTS

| | | |
|---|---|---|
| KR | 20170136080 A * 12/2017 | |
| WO | WO-2017223219 A1 * 12/2017 | ............. G01N 29/11 |

OTHER PUBLICATIONS

CN-104950260-A_English Translation (Year: 2015).*
EP-2762908-A1_English Translation (Year: 2014).*
WO-2017223219-A1 Machine Translation.*

\* cited by examiner

* Train  * Primary Test  △ Secondary Test

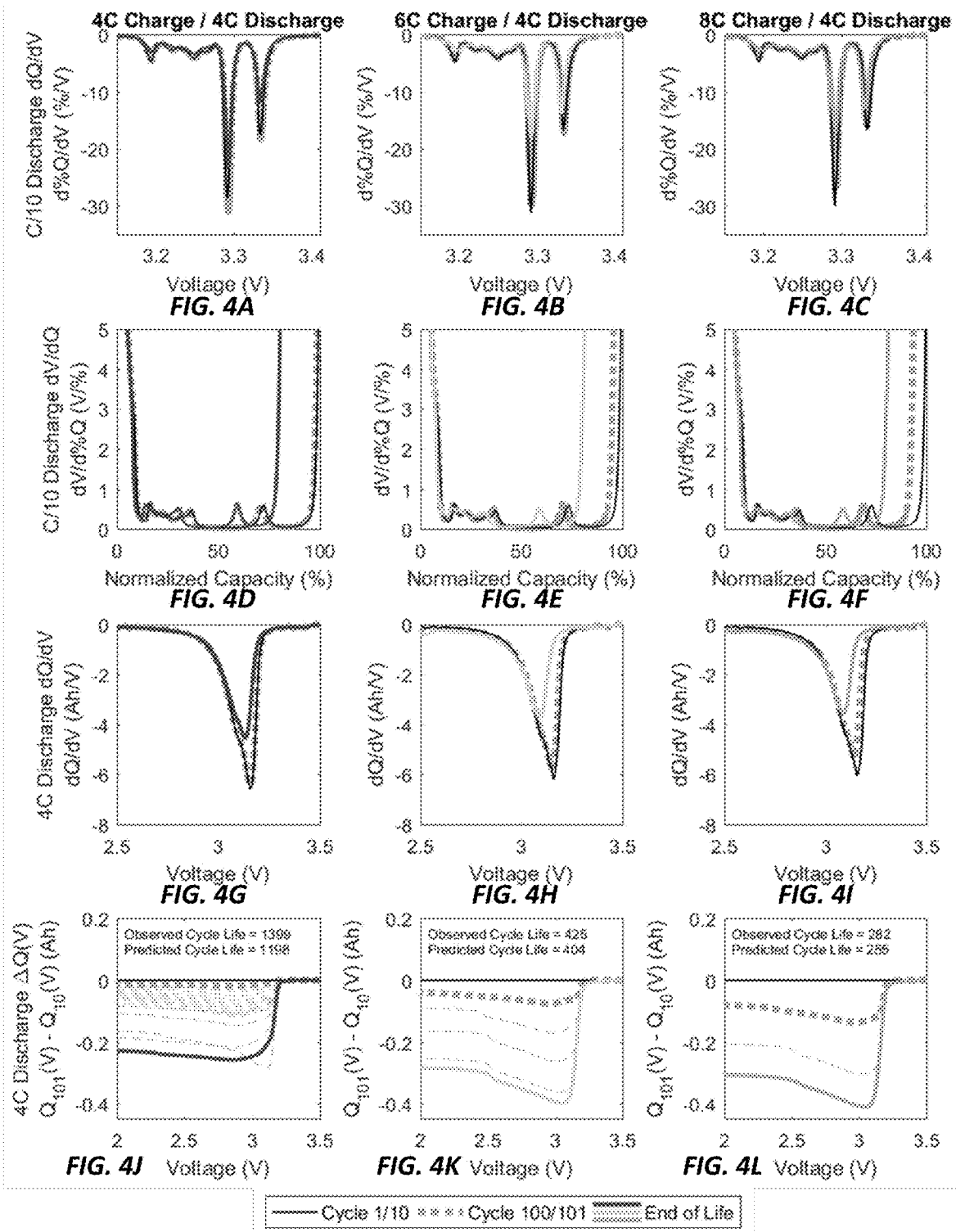

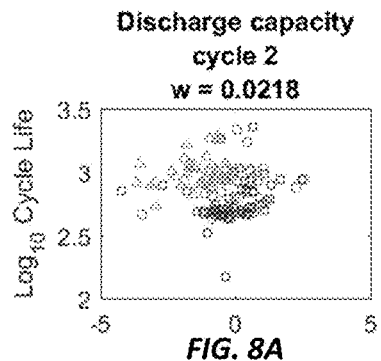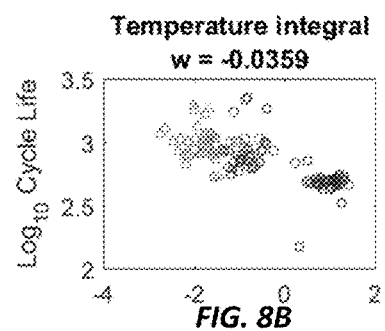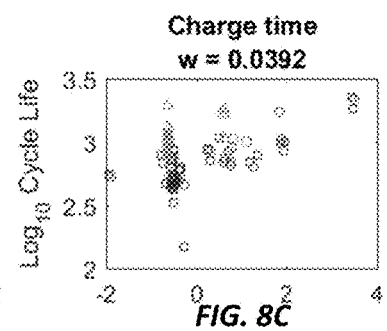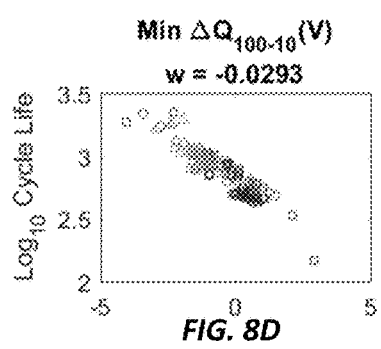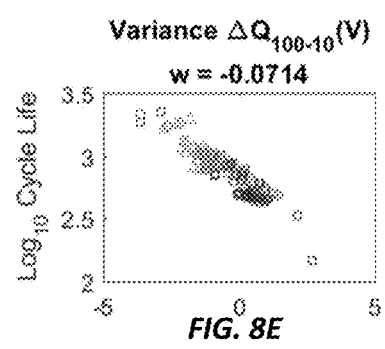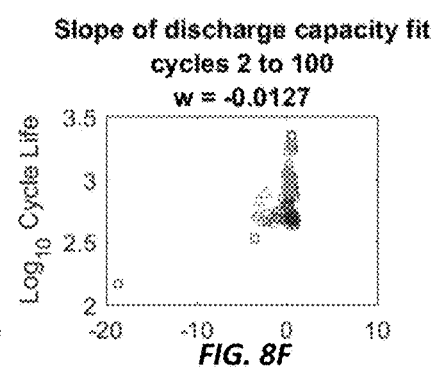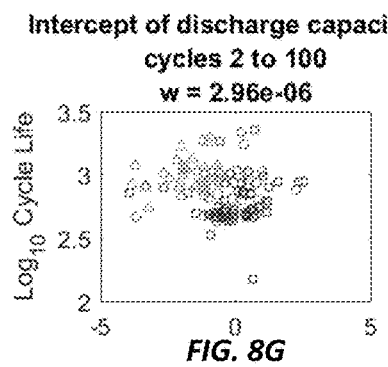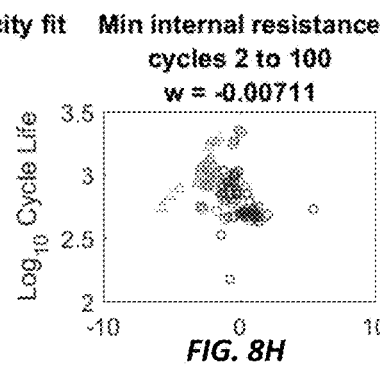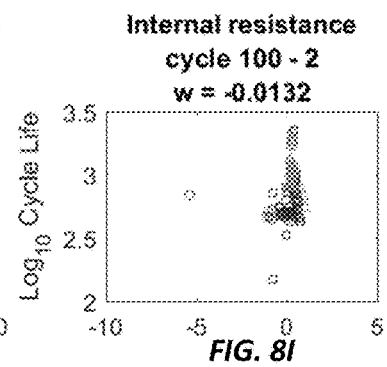

DATA-DRIVEN MODEL FOR LITHIUM-ION BATTERY CAPACITY FADE AND LIFETIME PREDICTION

CROSS-REFERENCE TO RELATED APPLICATIONS

This application claims priority from U.S. Provisional Patent Application 62/573,565 filed Oct. 17, 2017, which is incorporated herein by reference.

FIELD OF THE INVENTION

The current invention generally relates to battery lifetime. More particularly, the invention relates to a method of accurately predict the lifetime of battery cells using early-cycle data, with no prior knowledge of degradation mechanisms.

BACKGROUND OF THE INVENTION

Lithium-ion batteries are deployed in a wide range of applications due to their low and falling costs, high energy densities, and long cycle lives. However, as is the case with many chemical, mechanical, and electronic systems, long battery cycle life entails delayed to feedback of performance, often many months to years. Accurate prediction of cycle life using early-cycle data would unlock new capabilities in battery manufacture, optimization, and use. For example, battery manufacturers could accelerate the cell development cycle, perform rapid validation of new manufacturing batches, and grade newly-produced cells by their expected lifetime. Additionally, users of consumer electronics and electric vehicles could estimate their battery life expectancy. Finally, early prediction of failure enables high-throughput optimization applications, such as fast charging and formation cycling, that are otherwise intractable due to the extraordinary time and equipment cost. The task of predicting capacity fade and/or cycle life for lithium-ion batteries is challenging because of nonlinear degradation with cycling and wide variability, even when controlling for operating conditions, but is of critical importance given its broad utility.

Many studies have modeled cycle life in lithium-ion batteries. Early work has been done that fits semi-empirical models to predict power and capacity loss. Since then, many others have proposed physical and semi-empirical battery degradation models that account for diverse mechanisms such as growth of the solid-electrolyte interphase, lithium plating, active material loss, and impedance increase. Predictions of remaining useful life in battery management systems often rely on these mechanistic and semi-empirical models. Specialized diagnostic measurements such as coulombic efficiency and impedance spectroscopy can also estimate cycle life. While these chemistry and/or mechanism-specific models have shown predictive success, developing models that describe full cells cycled under relevant conditions (e.g., fast charging) remains challenging, given the many degradation modes and their coupling to the thermal and mechanical heterogeneities within a cell.

Approaches using statistical and machine learning techniques to predict cycle life are attractive, mechanism-agnostic alternatives. Recently, advances in computational power and data generation have enabled these techniques to accelerate progress for a variety of tasks, including prediction of material properties, identification of chemical syntheses routes, and materials discovery for energy storage and catalysis. A growing body of literature applies machine learning techniques for predicting the remaining useful life of batteries using data collected under both laboratory and real world conditions. Generally, these works make predictions after accumulating data corresponding to degradation of at least 25% along the trajectory to failure or using specialized measurements at the beginning of life and do not include model interpretation. Accurate early prediction of cycle life with significantly less degradation is challenging because of the typically nonlinear degradation process (with negligible capacity degradation in early cycles) as well as the relatively small datasets used to date that span a limited range of lifetimes. For example, on group correlated capacity values at cycle 80 to capacity values at cycle 500 for 24 cells exhibiting nonlinear degradation profiles, identifying only a weak correlation ($\varrho = 0.1$). In short, opportunities for improving upon state-of-the-art prediction models include higher accuracy, earlier prediction, greater interpretability, and broader application to a wide range of cycling conditions.

What is needed is a method of accurately predict the cycle life of commercial battery cells using early-cycle data, with no prior knowledge of degradation mechanisms.

SUMMARY OF THE INVENTION

To address the needs in the art, a method of using data-driven predictive modeling to predict battery cells by lifetime is provided that includes collecting a training dataset by cycling, using a battery cycling instrument, a plurality of battery cells between a voltage V1 and a voltage V2, continuously measuring battery cell physical properties that include a battery cell voltage, a battery cell current, a battery cell can temperature, a battery cell internal resistance of each battery cell during cycling, generating, using an algorithm on a non-transitory computer medium, a voltage curve for each battery cell, where the voltage curve is dependent on a capacity for a given cycle, calculating, using data from the voltage curve, a cycle-to-cycle evolution of a battery cell charge to output a cell voltage versus charge curve Q(V), generating, using the algorithm, transformations of a ΔQ(V), generating, using the algorithm, transformations of data streams includes capacity, temperature, internal resistance, applying a machine learning model, using the algorithm, to determine a combination of a subset of the transformations to predict battery cell operation characteristics, and applying the machine learning model to output the predicted battery operation characteristics of the cycled plurality of battery cells, or additional battery cells operated at a later date.

According to one aspect of the invention, the battery cell physical properties include a battery cell voltage, a battery cell current, a battery cell can temperature, or a battery cell internal resistance.

In another aspect of the invention, the continuous measurement further includes an electrochemical impedance, using spectroscopy, and strain, using a strain gauge.

In a further aspect of the invention, the transformation of the of a ΔQ(V) include a value at the V1, or a value at the V2.

In yet another aspect of the invention, the battery cell operation characteristics include a battery cycle life, a logarithm of the battery cycle life, or a Boolean classification of battery performance, where the battery cycle life includes a cycle life, energy, or power.

According to another aspect of the invention, the output battery cell operation characteristics are selected from the group consisting of a lifetime output, a logarithm of predicted cycle life output, or a predicted classification of battery performance output, where the battery life includes a cycle life, calendar life, energy, or power.

BRIEF DESCRIPTION OF THE DRAWINGS

FIGS. 4A-4L show the results of three cells that were tested with periodic slow diagnostic cycles. In (4A-4C) the plots are dQ/dV using slow cycling, in (4D-4F) dV/dQ using slow cycling, (4G-4I) dQ/dV using fast cycling, and (4J-4L) $\Delta Q(V)$ using fast cycling. The solid black line is the first cycle (cycle 10 for fast cycling), the dotted grey line is cycle 101 or 100 (fast and slow, respectively), and the grey thick line is the end of life cycle (80% SOH). For $\Delta Q(V)$, a thin dotted grey line is added every 100 cycles. The patterns observed using slow cycling are consistent with $LAM_{deNE}$ and LLI. The features are smeared during fast charging. The log variance $\Delta Q(V)$ model trained using the high-throughput dataset is able to predict lifetime within 15%, according to embodiments of the current invention.

FIGS. 8A-8I show nine features used in the full model described in Table 3. The coefficient value for the feature in the linear model is in the title of plot. The train, primary test, and secondary test cells are represented by circles, squares, and triangles, respectively. Each of the features has been z-scored based on the training data, according to the current invention.

such that each $\Delta Q(V)$ uses the same number of elapsed cycles. (12B-12C) The average errors for models using the variance of $\Delta Q(V)$ for the training and test data, according to the current invention.

DETAILED DESCRIPTION

Figure 1A:
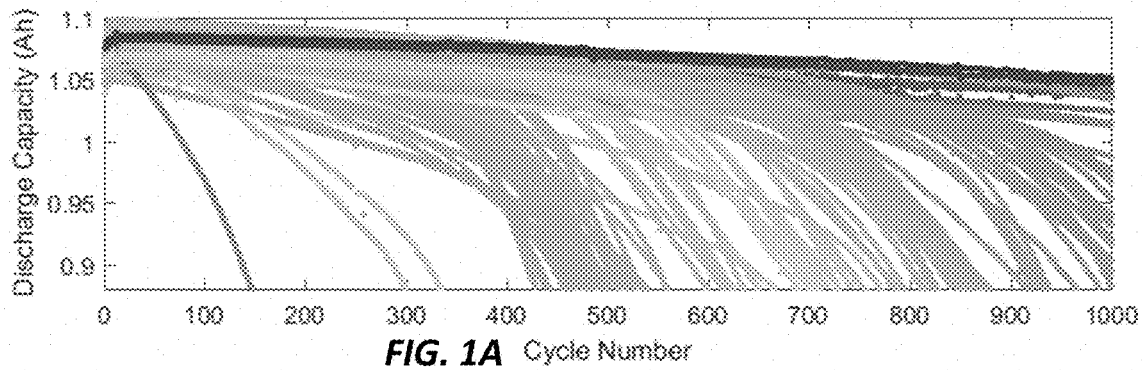
FIGS. 1A-1F show embodiments of the invention including (1A), discharge capacity for the first 1,000 cycles of LFP/graphite cells. The color of each curve is scaled based on the battery's cycle life, as is done throughout the disclosure. (1B), A detailed view of (1A), showing only the first 100 cycles. A clear ranking of cycle life has not emerged by cycle 100. (1C), Histogram of the state of health at cycle 100. The cell will the largest degradation (90%) is excluded to show the detail of the rest of the distribution. (1D), Cycle life as a function of discharge capacity at cycle 2. The correlation coefficient of capacity at cycle 2 and log cycle life is −0.06. (1E), Cycle life as a function of discharge capacity at cycle 100. The correlation coefficient of capacity at cycle 100 and log cycle life is 0.27. (1F), Cycle life as a function of the slope of the discharge capacity curve for cycles 95 through 100. The correlation coefficient of this slope and log cycle life is 0.47.

Accurately predicting the lifetime of complex and nonlinear systems such as lithium-ion batteries is crucial for accelerating technology development. However, diverse aging mechanisms, significant device variability, and dynamic operating conditions have remained major challenges. To study this problem, a comprehensive dataset was generated that included 124 commercial lithium-iron-phosphate/graphite cells cycled under fast charging conditions. These cells exhibited widely varied cycle lives spanning from 150 to 2,300 cycles, with end-of-life defined as 20% degradation from nominal capacity. Using discharge voltage curves from early cycles yet to exhibit capacity degradation, machine learning tools were applied both to predict and classify cells by cycle life. In some examples, the best models achieve 9.1% test error for quantitatively predicting cycle life using the first 100 cycles (exhibiting a median of 0.2% increase from initial capacity) and 4.9% test error using the first 5 cycles for classifying cycle life into two groups. The current invention is a significant improvement over previous predictive models that require at least 25% capacity degradation relative to the end of life. Additionally, it highlights the promise of combining deliberate data generation with data-driven modeling to predict the behavior of complex and nonlinear dynamical systems.

Data-driven modeling is a promising route for diagnostics and prognostics of lithium-ion batteries cycled under relevant conditions. The current invention provides cycle life prediction models using early-cycle discharge data yet to exhibit capacity degradation, generated from commercial LFP/graphite batteries cycled under fast charging conditions. In examples provided herein, the models achieve prediction errors of 15% using data from only the $10^{th}$ and $100^{th}$ cycles and errors as low as 8% using the first 100 cycles for batteries with lifetimes ranging from 150 to 2,300 cycles. In the classification setting, a test error of 4.9% was obtained using data from the first 5 cycles. This level of accuracy is achieved by extracting features from high-rate discharge voltage curves as opposed to only from the capacity fade curves, and without using data from slow diagnostic cycles nor assuming prior knowledge of cell chemistry and degradation mechanisms. The success of the model is rationalized by demonstrating consistency with degradation modes that do not manifest in capacity fade during early cycles but do impact the voltage profiles. In general, early prediction models are expected to be especially effective for degradation modes that do not initially contribute to capacity fade, such as voltage fade in high-voltage cathode materials. The current invention can complement approaches based on physical and semi-empirical models and on specialized diagnostics. Broadly speaking, this invention highlights the promise of combining data generation and data-driven modeling for understanding and developing complex systems such as lithium-ion batteries.

It is generally accepted that the graphite negative electrode dominates degradation in commercial lithium-iron-phosphate (LFP)/graphite cells, and therefore the results here could be useful for other lithium-ion batteries based on graphite. Here, cycle life (or equivalently, end-of-life) is defined as the number of cycles until 80% of nominal capacity. Provided herein is a dataset that includes 124 cells with cycle lives ranging from 150 to 2,300 by using 72 different fast-charging conditions. For quantitatively predicting cycle life, included are feature-based models that achieve prediction errors of 15% using only discharge voltage curves from the $10^{th}$ and $100^{th}$ cycles, at which point most batteries have yet to exhibit capacity degradation. The test error further reduces to 9.1% by incorporating data from additional cycles, internal resistance, and temperature measurements. Furthermore, using data from the first 5 cycles, demonstrated herein is classification into low- and high-lifetime groups and achievement of a misclassification test error of 4.9%. These results illustrate the power of combining data generation with data-driven modeling to predict the behavior of complex systems far into the future.

In a further aspect of the invention, the cycling of the battery cells between the voltage V1 and the voltage V2 is up to 5 cycles. In one aspect of the invention, the cycling of the battery cells between the voltage V1 and the voltage V2 is up to 10 cycles. In a further aspect of the invention, the cycling of the battery cells between the voltage V1 and the voltage V2 is in a range from 10 to 100 cycles. According to other embodiments the cycling of the battery cells between the voltage V1 and the voltage V2 is up to 100, or at least 100.

Regarding data generation, it is expected that the space that parameterizes capacity fade in lithium-ion batteries to be high dimensional due to their many capacity fade mechanisms and manufacturing variability. To probe this space, commercial LFP/graphite cells (A123 Systems, model APR18650M1A, 1.1 Ah nominal capacity) were cycled in a temperature-controlled environmental chamber (30° C.) under varied fast charging conditions but identical discharging conditions (4 C to 2.0 V, where 1 C is 1.1 A; as discussed below). By deliberately varying the charging conditions, a dataset was generated that captures a wide range of cycle lives, from approximately 150 to 2,300 cycles (average cycle life of 806 with a standard deviation of 377). While the air temperature in the chamber is controlled, the cell temperatures vary by up to 10° C. within a cycle due to the high heats generated during charge and discharge. The extent of this temperature variation varies from cell to cell as a function of internal impedance and charging policy. Voltage, current, cell can temperature, and internal resistance are continuously measured during cycling. A full description of the experimental details is discussed below. The dataset contains approximately 96,700 cycles, where it is surmised that this dataset is the largest publicly available for commercial lithium-ion batteries cycled under controlled conditions.

Figure 1B:
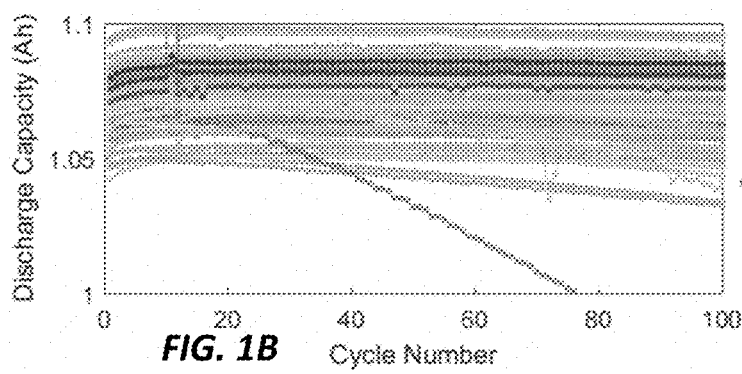
Figure 1C:
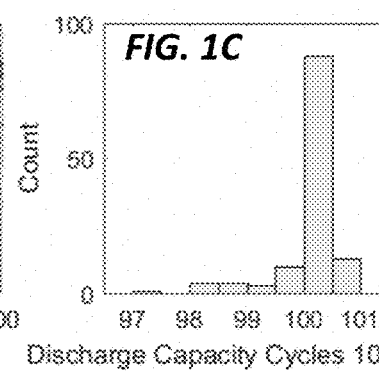
Figure 1D:
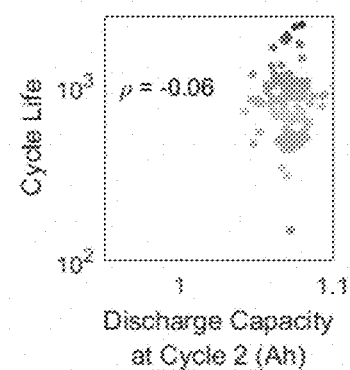
Figure 1E:
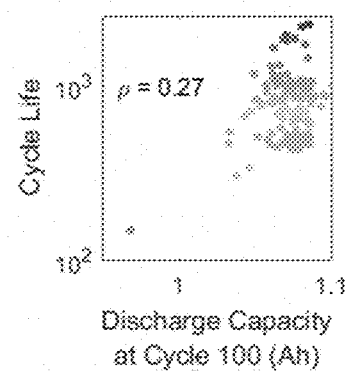
Figure 1F:
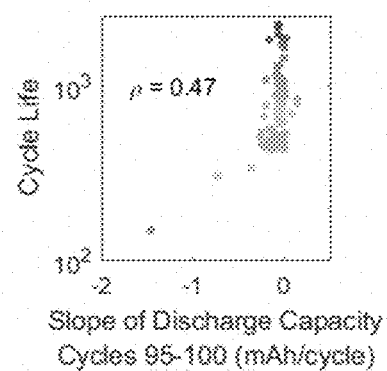

FIGS. 1A-1B show the discharge capacity as a function of cycle number for the first 1,000 cycles, where the gray scale denotes the cycle life. The capacity fade is negligible in the first one hundred cycles and accelerates near the end of life, as is often observed in lithium-ion batteries. The fact that the capacity fade trajectories cross each other illustrates the weak relationship between initial capacity and lifetime. Indeed, there exists weak correlations between the log of cycle life and the discharge capacity at the $2^{nd}$ cycle ($\rho=-0.06$, FIG. 1D) and the $100^{th}$ cycle ($\rho=0.27$, FIG. 1E), as well as between the log of cycle life and the capacity fade rate near cycle 100 ($\rho=0.47$, FIG. 1F). These weak correlations are expected because capacity degradation in these early cycles is negligible; in fact, the capacities at cycle 100 increased from the initial values for 81% of cells in this dataset (FIG. 1C). Given the limited predictive power of these correlations based on the capacity fade curves, an alternative data-driven approach is provided herein that considers a larger set of cycling data which includes the full voltage curves of each cycle, as well as additional measurements including cell internal resistance and temperature.

Turning now to machine learning, the current invention uses a feature-based approach for building an early prediction model. In this paradigm, features, which are transformations of the raw data, are generated and used in a regularization framework. In one embodiment, the final model uses a linear combination of a subset of the features to predict the logarithm of cycle life. This subset is identified using the elastic net. The choice of a linear model and regularization framework allows for domain-specific features of varying complexity while maintaining high interpretability of the feature subset in the final model. A description of the computational framework can be found in the discussion relating to the methods below.

Figure 2A:
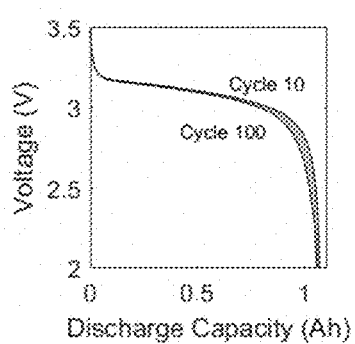
FIGS. 2A-2C show embodiments of the invention including (2A), Discharge capacity curves for $100^{th}$ and $10^{th}$ cycles for a representative cell. (2B), Difference of the discharge capacity curves as a function of voltage between the $100^{th}$ and $10^{th}$ cycles, $\Delta Q_{100-10}(V)$, for 124 cells. (2C), Cycle life plotted as a function of the variance of $\Delta Q_{100-10}(V)$ on a log-log axis, with a correlation coefficient of −0.93. In all plots, the colors are determined based on the final cycle lifetime. In c, the color is redundant with the y-axis.

The current invention includes features (Table 2) based on domain knowledge of lithium-ion batteries (though agnostic to chemistry and degradation mechanisms), such as initial discharge capacity, charge time, and cell can temperature. To capture the electrochemical evolution of individual cells during cycling, several features are calculated based on the discharge voltage curve (FIG. 2A). Specifically, the cycle-to-cycle evolution of Q(V), the discharge voltage curve as a function of voltage for a given cycle are considered. As the voltage range is identical with every cycle, capacity as a function of voltage is considered, as opposed to voltage as a function of capacity, in order to maintain a uniform basis for comparing cycles. For instance, the change in discharge voltage curve between cycles 20 and 30 can be considered, denoted $\Delta Q_{30-20}(V)=Q_{30}(V)-Q_{20}(V)$, where the subscripts indicate the cycle number. This data transformation, $\Delta Q(V)$, is of particular interest because voltage curves and their derivatives are a rich data source that have been effective in degradation diagnosis.

Figure 2B:
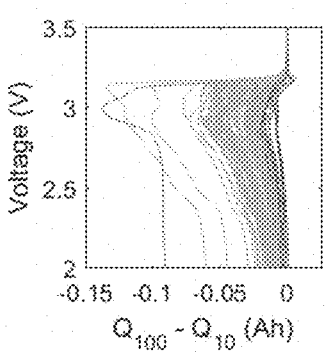
Figure 2C:
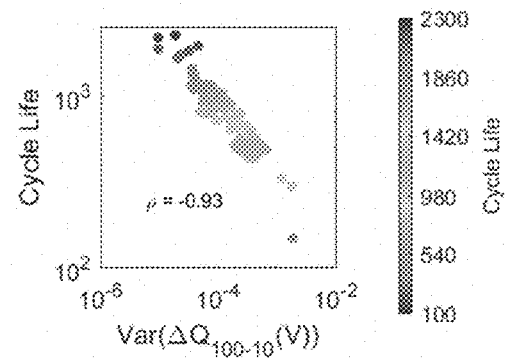

The $\Delta Q(V)$ curves for these datasets are shown in FIG. 2B using the $100^{th}$ and $10^{th}$ cycles, i.e., $\Delta Q_{100-10}(V)$, as well as using the $5^{th}$ and the $1^{st}$ cycle, i.e., $\Delta Q_{5-1}(V)$. Discussed herein is the selection of these cycle numbers at a later point. Summary statistics, e.g. minimum, mean, and variance, were then calculated for the $\Delta Q(V)$ curves of each cell. Each summary statistic is a scalar quantity that captures the change in the voltage curves between two given two cycles. In this data-driven approach, these summary statistics are selected based on their predictive ability, not their physical meaning. Immediately, a clear trend emerges between the cycle life of a cell and a summary statistic, specifically variance, applied to $\Delta Q_{100-10}(V)$ (FIG. 2C).

Because of the high predictive power of features based on $\Delta Q_{100-10}(V)$, three different models were investigated (1) using only the variance of $\Delta Q_{100-10}(V)$, (2) considering additional candidate features obtained during discharge, and (3) considering features including both charging and discharging. In all cases, data were taken from the first 100 cycles. These three models, each with progressively more features, were chosen to evaluate both the cost-benefit of acquiring additional data streams such as temperature and the limits of prediction accuracy. The complete set of 20 candidate features is shown in Table 2 and is described in detail below. The training data (41 cells) is used to select the model features and set the values of the coefficients, and the primary testing data (43 cells) is used to evaluate the model performance. The model is then evaluated on a secondary, unseen testing dataset of 40 cells generated after model development. Two metrics, defined in the section below describing the computational methods, are used to evaluate performance of the cycle life prediction: root-mean-squared error (RMSE), with units of cycles, and average percent error.

Turning now to the results, presented herein are three models to predict cycle life using increasing candidate feature set sizes. The first model, denoted as the "variance" model, does not consider subset selection and uses only the log variance of $\Delta Q_{100-10}(V)$ for prediction. Surprisingly, using only this single feature results in a model that has approximately 15% average percent error on the primary test dataset and approximately 11% average percent error on the secondary test dataset. The error metrics of the secondary test dataset are stressed, as these data had not been generated at the time of model development and are thus a rigorous test of model performance. The second, "discharge" model, considers additional information derived from measurements of voltage and current during discharge in the first 100 cycles (row blocks 1 and 2 of Table 2). Six out of thirteen features were selected. Finally, the third, "full" model, considers all available features (all rows blocks of Table 2). In this model, nine out of twenty features were selected. As expected, by adding additional features, the test average percent error decreases to 7.5% and the additional test average percent error decreases slightly to 10.7%. In all cases, the average percent error is less than 15% and reduces to as low as 7.5% in the full model, excluding an anomalous cell. Table 1 and FIG. 3 display the performance of the "variance", "discharge", and "full" models applied to the train, primary test, and secondary test datasets, and the specific features and model coefficients used in the full model are displayed in FIG. 6.

TABLE 1

Model metrics for the results shown in FIG. 3. Train and test refer to the data used to learn the model and evaluate model performance, respectively. One battery in the test set reaches 80% State Of Health (SOH) rapidly and does not match other observed patterns. Therefore, the parenthetical primary test results correspond to the exclusion of this battery.

|  | RMSE (cycles) | | | Mean Percent Error | | |
| --- | --- | --- | --- | --- | --- | --- |
|  | Train | Primary Test | Secondary Test | Train | Primary Test | Secondary Test |
| "Variance" model | 103 | 138 (138) | 196 | 14.1% | 14.7% (13.2%) | 11.4% |
| "Discharge" model | 76 | 91 (86) | 173 | 9.8% | 13.0% (10.1%) | 8.6% |
| "Full" model | 51 | 118 (100) | 214 | 5.6% | 14.1% (7.5%) | 10.7% |

The performance of the cycle life prediction is benchmarked using early-cycle data against both prior literature and naïve models. A relevant metric is the extent of degradation that has to occur before an accurate prediction can be made. In current invention, accurate prediction was achieved using voltage curves from early cycles corresponding to capacity increase of 0.2% (median) relative to initial values (with the first and third quartile percentiles being 0.06% and 0.34%, respectively; see FIG. 1C). The inventors are not aware of previous early prediction demonstrations that do not require degradation in the battery capacity nor specialized measurements. In fact, published models generally require data corresponding to at least 5% capacity degradation before making a prediction at an accuracy comparable to this example embodiment. Also benchmarked is the model performance using naïve models, e.g. univariate models and/or models that only utilize information from the capacity fade curve (discussed below for benchmarking models).

Notably, if the average cycle life of the training data is used for prediction, the average percent error is approximately 30% and 36% for the primary and secondary test data, respectively. The best benchmark model has errors of 25% and 34% for the primary and secondary test data, respectively.

The contexts in which a prediction is required at very low cycle number but the requirements for prediction accuracy are less stringent were considered, such as sorting/grading applications. As an example, a logistic regression model was developed to classify cells into either a "low lifetime" or "high lifetime" group, using only the first 5 cycles for various cycle life thresholds. For the "variance classifier", the $\Delta Q(V)$ variance feature was used between the $4^{th}$ and $5^{th}$ cycles, $var(\Delta Q_{5-4}(V))$, and attain a test classification accuracy of 88.8%. For the "full classifier", regularized logistic regression was used with eighteen candidate features to achieve a test classification accuracy of 95.1%. These results are detailed in Table 2 and in the early-cycle classification discussed below. This approach illustrates the predictive ability of $\Delta Q(V)$ even if data from the only first few cycles are used, and, more broadly, highlights the flexibility to tailor data-driven models to various use cases.

TABLE 2

Model metrics for the classification setting with a cycle life threshold of 550 cycles. Train and primary/secondary test refer to the data used to learn the model and evaluate model performance, respectively.

|  | Classification accuracy (%) | | |
| --- | --- | --- | --- |
|  | Train | Primary Test | Secondary Test |
| Variance classifier | 82.1 | 78.6 | 97.5 |
| Full classifier | 97.4 | 92.7 | 97.5 |

While models that include features based on additional data streams such as internal resistance and casing temperature generally have the lowest errors, the primary predictive ability comes from the variance of $\Delta Q(V)$ feature, as evidenced by the performance of the single-feature "variance" model. This feature is consistently selected in both models with feature selection ("discharge" and "full"). Other transformations of this trajectory can also be used to predict cycle life, alone or in combination with variance. For example, the full model selects the minimum and variance of the $\Delta Q(V)$ features. The physical meaning of the variance feature is associated with the dependence of the discharged energy dissipation on voltage, which is indicated by the region between the voltage curves in FIG. 2A. The integral of this region is the total change in energy dissipation between cycles under galvanostatic (using a battery cycling instrument, or galvanostat/potentiostat) conditions and is linearly related to the mean of $\Delta Q(V)$. Zero variance would indicate energy dissipations that do not depend on voltage. Thus, the variance of $\Delta Q(V)$ reflects the extent of non-uniformity in the energy dissipation with voltage, due to either open-circuit or kinetic processes, a point that is returned to later.

The inventors observed that features derived using early-cycle discharge voltage curve have excellent predictive performance, even before the onset of capacity fade. This observation is rationalized by investigating degradation modes that do not immediately result in capacity fade yet still manifest in the discharge voltage curve and are also linked to rapid capacity fade near the end-of-life.

While the data-driven approach disclosed herein has successfully revealed predictive features of cycle life from early cycle discharge curves, identification of the degradation modes using only high rate data is challenging because of the convolution of kinetics with open-circuit behavior. Others have previously used low-rate diagnostic cycles to remove these kinetic effects and mapped degradation modes in LFP/graphite cells to their resultant shift in dQ/dV and dV/dQ derivatives for diagnostic cycles at C/20. One degradation mode—loss of active material of the delithiated negative electrode ($LAM_{deNE}$)—results in a shift in discharge voltage with no change in capacity. This behavior is observed when the negative electrode is oversized relative to the positive electrode, as is the case in the LFP/graphite cells examined in this discussion. Thus, a loss of delithiated negative electrode material changes the potentials at which lithium ions are stored without changing the overall capacity. As previously proposed, at high rates of $LAM_{deNE}$, the negative electrode capacity will eventually fall below the lithium-ion inventory remaining in the cell. At this point, the negative electrode will not have enough sites to accommodate lithium ions during charging, inducing lithium plating. Since plating is an additional source of irreversibility, the capacity loss accelerates. Thus, in early cycles, $LAM_{deNE}$ shifts the voltage curve without affecting the capacity fade curve and induces rapid capacity fade at high cycle number. This degradation mode, in conjunction with loss of lithium inventory (LLI), is widely observed in commercial LFP/graphite cells operated under similar conditions and is common to nearly all commercial lithium-ion batteries in use today.

To investigate the contribution of $LAM_{deNE}$ to degradation in our experiments, additional experiments were performed for cells cycled with varied charging rates (4 C, 6 C, and 8 C) and a constant discharge rate (4 C), incorporating slow cycling at the $1^{st}$, $100^{th}$, and end of life cycles. Derivatives of diagnostic discharge curves at C/10 (FIG. 4, rows 1 and 2) are compared to those, and $\Delta Q(V)$, at 4 C at the $10^{th}$, $101^{th}$, and end of life cycles (rows 3 and 4). The shifts in dQ/dV and dV dQ observed in diagnostic cycling correspond to a shift of the potentials at which lithium is stored in graphite during charging and are consistent with $LAM_{deNE}$ and LLI operating concurrently. The magnitude of these shifts increases with charging rate. These observations rationalize why models using features based on discharge curves have lower errors than models using only features based on capacity fade curves, since $LAM_{deNE}$ does not manifest in capacity fade in early cycles. Other degradation modes that do not initially manifest in capacity fade have been reported, such as high-voltage cathode materials undergoing voltage fade. Note that $LAM_{deNE}$ alters a fraction of, rather than the entire, discharge voltage curve, consistent with the observed correlation between the variance of $\Delta Q(V)$ and cycle life.

The inventors recognize that the above rationalization uses low-rate diagnostic cycling, which is largely not affected by kinetics. However, the predictions were developed using high-rate discharge data. As such, these discharge voltage curves can reflect kinetic degradation modes that are not observed in dQ/dV and dV/dQ derivatives at C/10. Because a constant-voltage hold was performed at the end of both charge and discharge, kinetic degradation modes may manifest in the discharge voltage curve but not in the capacity fade curve. Note that the change in the discharge energy between the diagnostic cycles ($1^{st}$ and $100^{th}$ cycles) is 53% to 66% of the change between the $10^{th}$ and $101^{th}$ high-rate cycles, indicating the degradation is influenced by both low-rate and high-rate degradation modes (see below relating to the discussion directed to kinetic degradation). These kinetic contributions during early cycles may also be linked to cycle life, such as nonlinearities in reaction kinetics that could skew the voltage curves non-uniformly, and are part of an ongoing investigation.

As noted above, differential methods like dQ/dV and dV/dQ are used extensively to pinpoint degradation mechanisms. These approaches require low-rate diagnostic cycles, as higher rates smear out features due to heterogeneous charging, as seen by comparing FIGS. 4A-4C to FIGS. 4G-4I. These diagnostic cycles often induce a temporary capacity recovery that interrupts the trajectory of capacity fade (see FIG. 9), complicating the history of the battery. Therefore, by applying summary statistics to $\Delta Q(V)$ collected at high rate, both low-rate diagnostic cycles and numerical differentiation are simultaneously avoided, which decreases the signal-to-noise ratio.

Figure 5A:
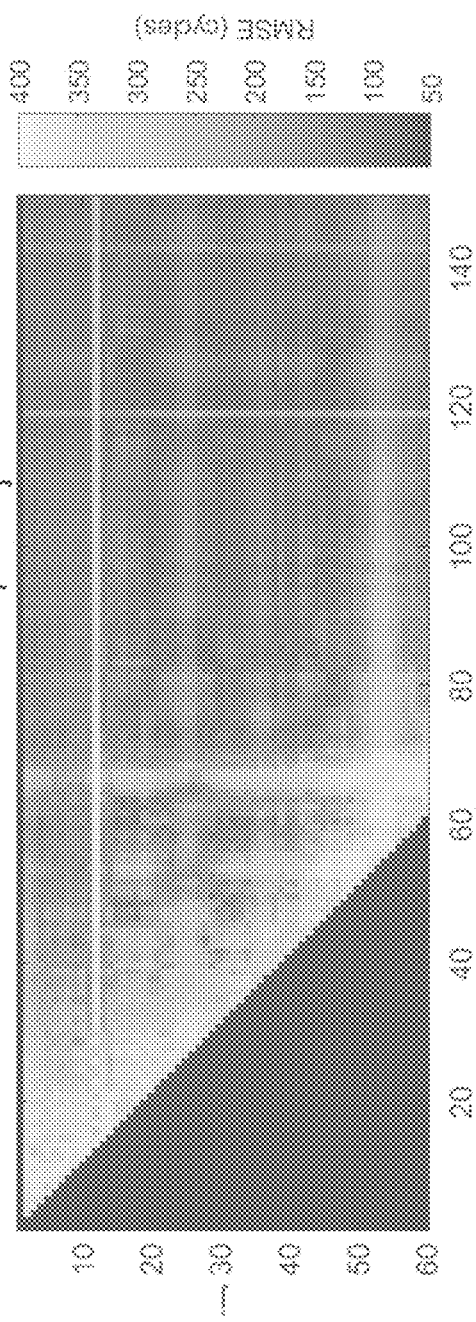
FIGS. 5A-5B show RMSE error, in cycles, for training and testing datasets using only the log variance of $\Delta Q_{i-j}(V)$, where the discharge cycles that are used in analysis are varied. These errors are averaged over 20 random partitions of the data into equal training and testing datasets. The errors are relatively flat after cycle 80. The increases in error around cycles j=55 and i=70 are due to temperature fluctuations of the chamber (see FIGS. 15A-15B for information on experimental temperature).
Figure 5B:
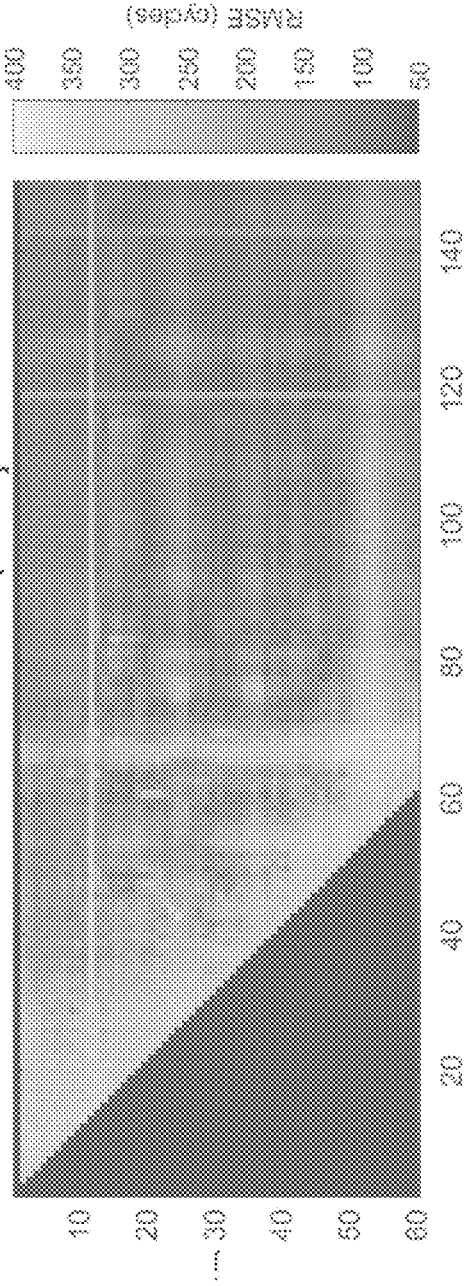
Figures 14A, 14B:
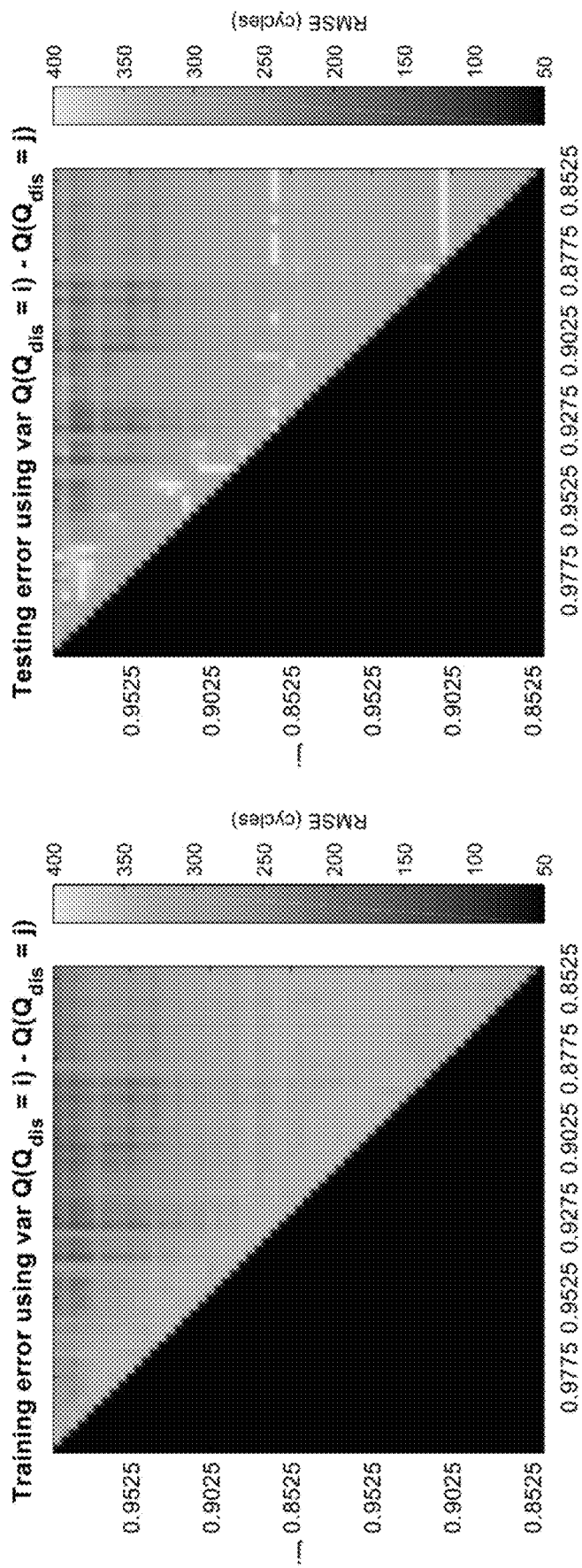
FIGS. 14A-14B show results of an alternate indexing scheme for the $\Delta Q(V)$ features. The indices are based on when the discharge capacity reaches a relative capacity fade. Relative capacity is determined by dividing the discharge capacity trajectory by the maximum capacity achieved by the battery. An example is shown in Figure S8. The model uses the variance of ΔQ(V). RMSE values greater than 400 are thresholded to improve readability, according to one embodiment of the invention.

Finally, additional analysis during model development was performed to understand the impact of the cycle indices chosen for $\Delta Q(V)$ features. Linear models using only the variance of the difference $Q_i(V)-Q_j(V)$ for the training and testing datasets were investigated and are displayed in FIGS. 5A-5B. This model is found to be relatively insensitive to the indexing scheme for i>60, suggesting that prediction using even earlier cycles is possible. This trend is further validated by the model coefficients shown in FIGS. 14A-14B. It is hypothesized that the insensitivity of the model to the indexing scheme implies linear degradation with respect to cycle number, which is often assumed for LAM modes. Relative indexing schemes based on cycles in which a specified capacity fade was achieved were also investigated and did not result in improved predictions. Furthermore, because the discharge capacity initially increases, specified decreases in capacity take longer to develop in terms of cycles than fixed indexing (see below in discussion directed to the relative indexing schemes).

Figure 21A:
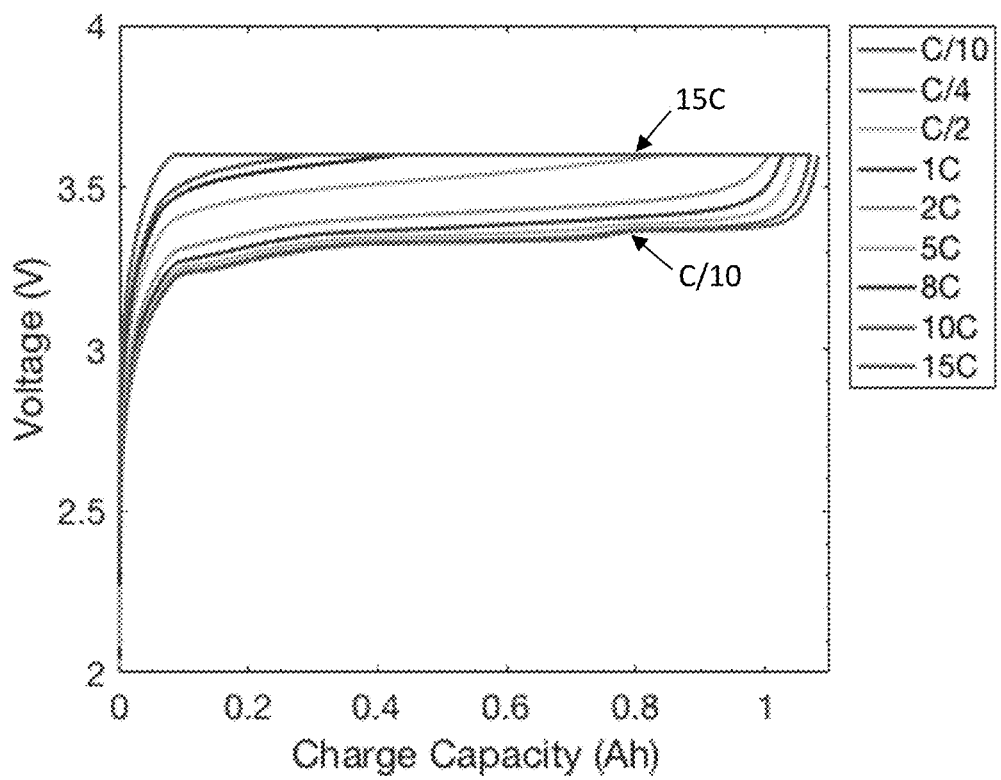
FIGS. 21A-21B show charge (21A) and discharge (21b) rate capability of an unaged A123 18650 M1A cell, according to the current invention.
Figure 21B:
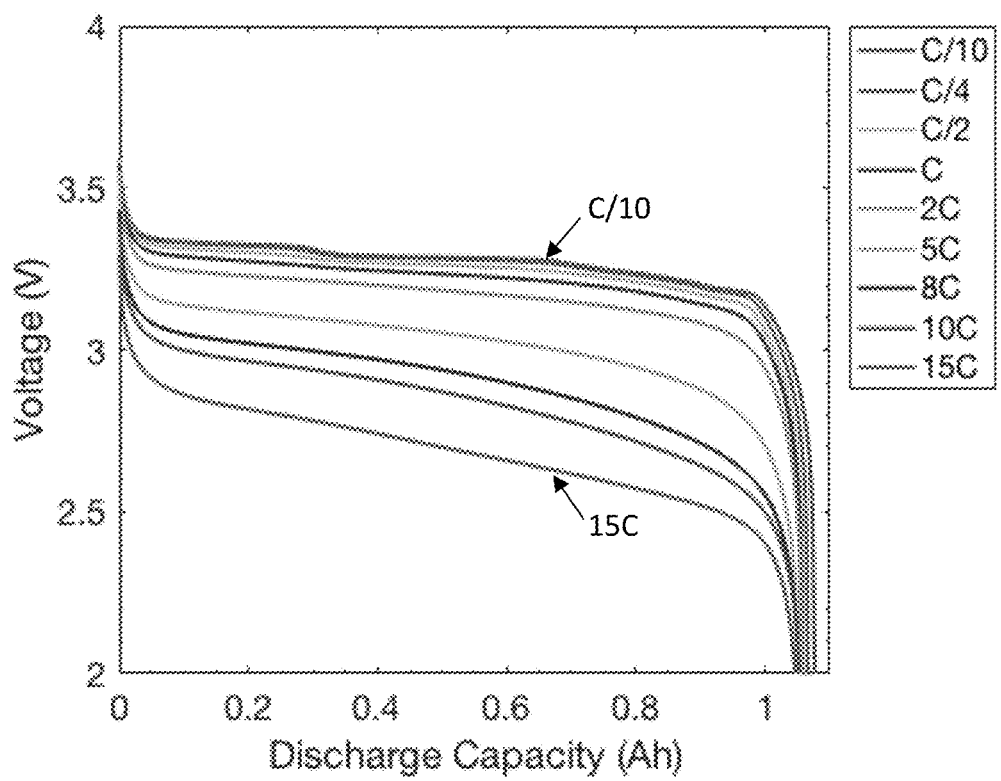

Turning now to an exemplary experiment, 124 commercial high-power LFP/graphite A123 APR18650M1A cells were used in this example. The cells have a nominal capacity of 1.1 Ah and a nominal voltage of 3.3 V. The manufacturer's recommended fast-charging protocol is 3.6 C CC-CV. Rate capability of these cells is shown in FIGS. 21A-21B.

All cells were tested in cylindrical fixtures with 4-point contacts on a 48-channel Arbin LBT battery testing cycler. The tests were performed at a constant temperature of 30° C. in an environmental chamber (Amerex Instruments). Cell can temperatures were recorded by stripping a small section of the plastic insulation and contacting a Type T thermocouple to the bare metal casing using thermal epoxy (OME-GATHERM 201) and Kapton tape.

The cells were cycled with various candidate fast-charging policies but identically discharged. Cells were charged from 0% to 80% SOC with one of 72 different one-step and two-step charging policies. Each step is a single C rate applied over a given SOC range; for example, a two-step policy could be a 6 C charging step from 0% to 50% SOC, followed by a 4 C step from 50% to 80% SOC. The 72 charging polices represent different combinations of current steps within the 0% to 80% SOC range. The charging time from 0% to 80% SOC ranged from 9 to 13.3 minutes. An internal resistance measurement was obtained during charging at 80% SOC by averaging 10 pulses of ±3.6 C with a pulse width of 30 ms, where 1 C is 1.1 A, or the current required to fully (dis)charge the nominal capacity (1.1 Ah) in 1 hour. All cells then charged from 80% to 100% SOC with a uniform 1 C CC-CV charging step to 3.6 V and a current cutoff of C/50. All cells were subsequently discharged with a CC-CV discharge at 4 C to 2.0 V with a current cutoff of C/50. The voltage cutoffs used in this work follow those recommended by the manufacturer.

Figure 22B:
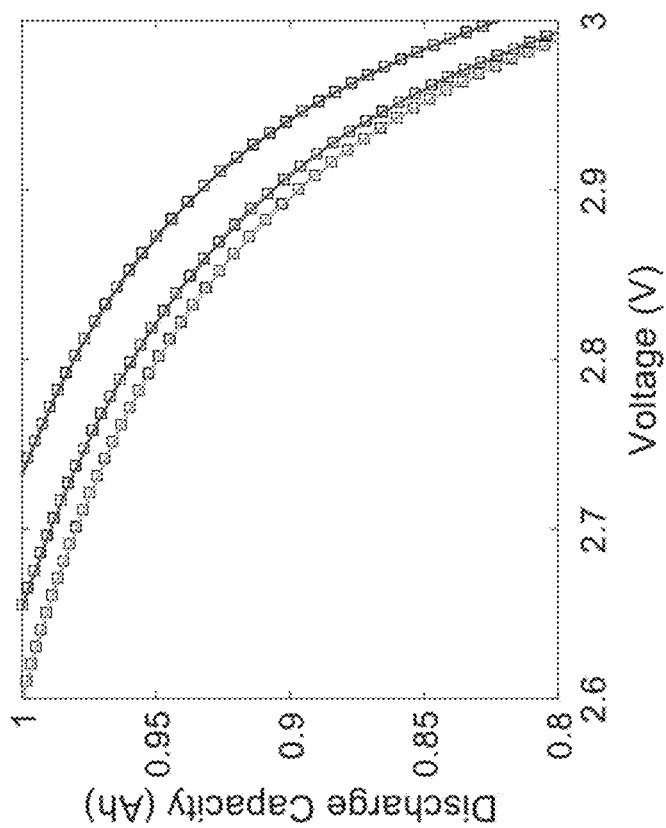
FIGS. 22A-22B show spline fits (solid lines) to the discharge capacity as a function of voltage (black squares) for three batteries at cycle 100. A smoothing spline accurately captures the relationship between discharge capacity and voltage and enables easy vector manipulation of the data, according to the current invention.
Figure 22A:
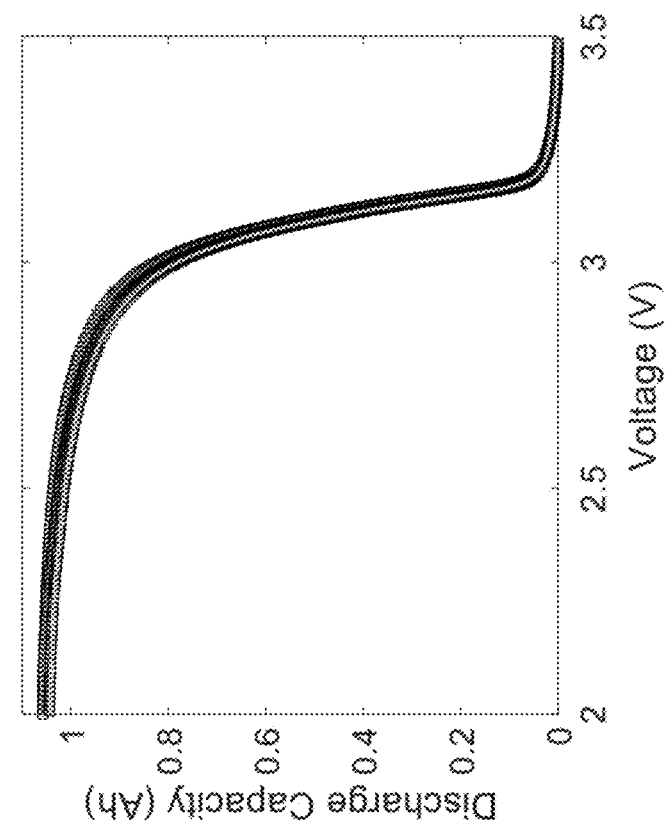

To standardize the voltage-capacity data across cells and cycles, all 4 C discharge curves were fit to a spline function and linearly interpolated (see FIGS. 22A-22B). Capacity was fit as a function of voltage and evaluated at 1000 linearly-spaced voltage points from 3.5 V to 2.0 V. These uniformly-sized vectors enabled straightforward data manipulations such as subtraction.

The current invention uses model fitting, selection of the coefficient values, and model selection (selection of the model structure). To perform both of these tasks simultaneously, a regularization technique was employed. A linear model of the form $$\hat{y}_i = \hat{w}^T x_i$$

was used, where $\hat{y}_i$ is the predicted number of cycles for battery i, $x_i$ is a p-dimensional feature vector for battery i, and $\hat{w}$ is a p-dimensional model coefficient vector. When applying regularization techniques, a penalty term is added to the least-squares optimization formulation to avoid overfitting. Two regularization techniques, the lasso and the elastic net, simultaneously perform fitting and selection of a linear model by finding sparse coefficient vectors. The formulation is $$\hat{w} = \underset{w}{\operatorname{argmin}} \|y - Xw\|_2^2 + \lambda P(w)$$

where y is the n-dimensional vector of observed battery lifetimes, X is the n×p matrix of features, and λ is a non-negative scalar. The term $$\|y-Xw\|_2^2$$

is found in ordinary least squares and is also referred to as squared loss because the optimization is minimizing the squared error. The formulation of the second term, P(w), depends on the regularization technique being employed. For the lasso, $$P(w) = \|w\|_1, \text{ and}$$

$$P(w) = \frac{1-\alpha}{2}\|w\|_2^2 + \alpha\|w\|_1$$

for the elastic net, where a is a scalar between 0 and 1. Both formulations will result in sparse models. The elastic net has been shown to perform better when p>>n, as is often the case in feature engineering applications, but requires fitting an additional hyper-parameter (α and λ, as opposed to only λ in the lasso). The elastic net is also preferred when there are high correlations between the features, as is the case in this application. To choose the value(s) of the hyper-parameter(s), 4-fold cross validation and Monte Carlo sampling are applied.

The model development dataset is divided into two equal sections, referred to as the training and primary testing data. The training data are used to choose the hyper-parameters α and λ and determine the values of the coefficients, w. The training data are further subdivided into calibration and validation sets for cross-validation. The testing data are then used as a measure of generalizability because this data has not been used to learn the model coefficients or form.

Root-mean-squared error (RMSE) and average percent error are chosen to evaluate model performance. RMSE is defined as $$RMSE = \sqrt{\frac{1}{n}\sum_{i=1}^{n}(y_i - \hat{y}_i)^2}$$

where $y_i$ is the observed cycle life, $\hat{y}_i$ is the predicted cycle life, and n is the total number of samples. The average percent error is defined as $$\%err = \frac{1}{n}\sum_{i=1}^{n}\frac{|y_i - \hat{y}_i|}{y_i} \times 100,$$

where all variables are defined as above.

Figure 6:
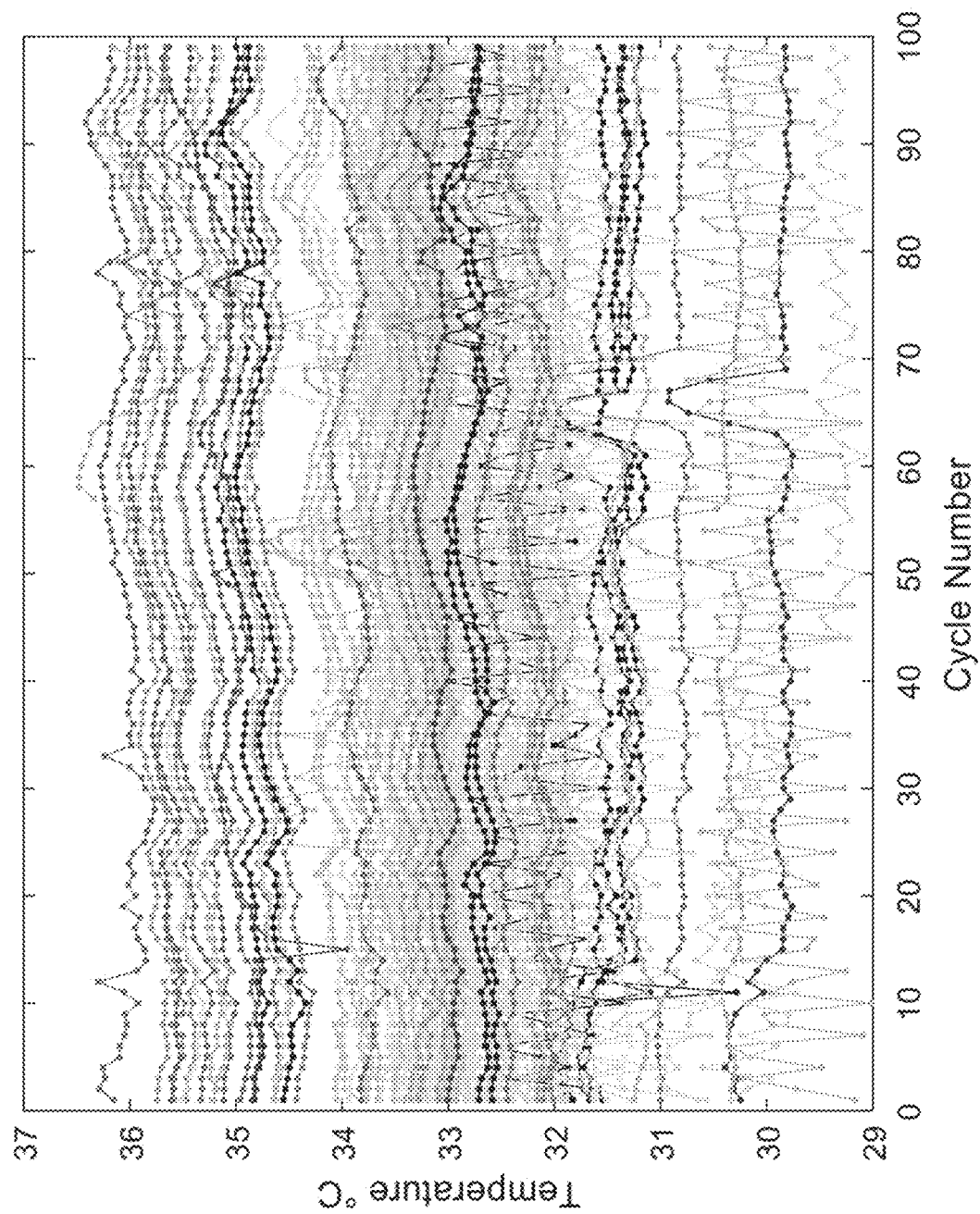
FIG. 6 shows the average cell temperature as a function of cycle number for all cells. The shade represents cycle life, according to embodiments of the current invention.

Turning now to cell conditions under test, FIG. 6 shows the average temperature for all cells as a function of cycle number. The average temperature varies by around 6° C. for each cell, largely as a function of charging policy, position within the temperature chamber, and internal cell impedance.

Figure 7:
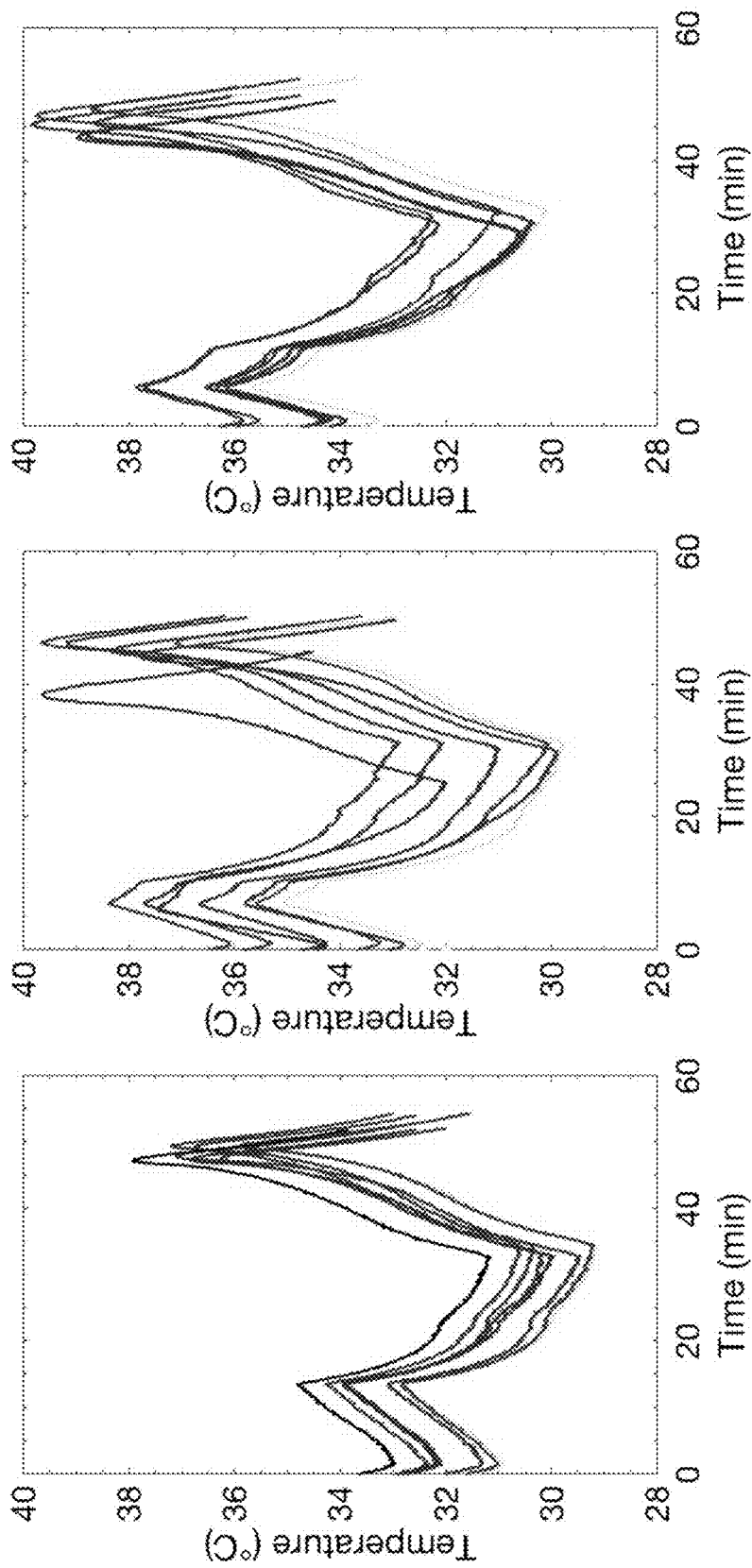
FIG. 7 shows the temperature profiles as a function of time and cycle number for three different cells. Each line represents a 100 cycle increment, and darker shades represent higher cycle number. The peak around 10 minutes is the peak during charge, which varies substantially as a function of charging policy, while the peak around 50 minutes is the peak during discharge, according to the current invention.

FIG. 7 shows the temperature profiles as a function of cycle number for three different cells. The temperature rises substantially during the rapid charge and discharge steps, varying by nearly 10° C. The temperature profiles generally rise as a function of cycle number as the cell impedance increases. Note that the contact between the cell and the thermocouple may vary during cycling as well.

The formulas for each of the features are given below, ordered as in Table 3, moving from top to bottom (unless otherwise noted, log implies log base 10). These features are functions of $$\Delta Q(V) = Q_{100}(V) - Q_{10}(V), \Delta Q(V) \in \mathbb{R}^p \quad (1)$$

$$\overline{\Delta Q}(V) = \frac{1}{p}\sum_{i=1}^{p}\Delta Q(V) \quad (2)$$

$$b^* = \underset{b}{\operatorname{argmin}}\frac{1}{d}\|q - Xb\|_2^2, \quad (3)$$

where d is the number of cycles used in the prediction, $q \in \mathbb{R}^d$ is a vector of discharge capacities as a function of the cycle number, $X \in \mathbb{R}^{d \times 2}$ where the first column are the cycle numbers used in prediction and the second column is ones, and $b \in \mathbb{R}^2$ is a coefficient vector. The features are Minimum=log(|min(ΔQ(V))|)
Mean=log(|$\overline{\Delta Q}$(V)|)

- Variance = $\log\left(\left|\frac{1}{p-1}\sum_{i=1}^{p}(\Delta Q(V) - \overline{\Delta Q}(V))^2\right|\right)$

- Skewness = $\log\left(\left|\frac{\frac{1}{p}\sum_{i=1}^{p}(\Delta Q(V) - \overline{\Delta Q}(V))^3}{\left(\sqrt{\sum_{i=1}^{p}(\Delta Q(V) - \overline{\Delta Q}(V))^2}\right)^3}\right|\right)$

- Kurtosis = $\log\left(\left|\frac{\frac{1}{p}\sum_{i=1}^{p}(\Delta Q(V) - \overline{\Delta Q}(V))^4}{\left(\frac{1}{p}\sum_{i=1}^{p}(\Delta Q(V) - \overline{\Delta Q}(V))^2\right)^2}\right|\right)$ Value at 2 V=log (|ΔQ(V=2)|)
Slope of discharge curve, cycles 2 to 100=the first value in the vector b* as in eqn. 3 where d=99
Intercept of the linear fit to Q(n), cycles 2 to 100, the second value in the vector b* as in eqn. 3 where d=99
Slope of Q(n), cycles 91 to 100=the first value in the vector b* as in eqn. 3 where d=10
Intercept of the linear fit to Q(n), cycles 91 to 100, the second value in the vector b* as in eqn. 3 where d=10
Discharge capacity, cycle 2=Q(n=2)
Max discharge capacity—discharge capacity, $$\text{cycle } 2 = \max_{n} Q(n) - Q(n=2)$$

Discharge capacity, cycle 100=Q(n=100)
Average charge $$\text{time} = \frac{1}{5}\sum_{i=2}^{6} \text{Charge Time}_i$$

Maximum temperature, $$\text{cycles 2 to 100} = \max_n T(n)$$

Minimum temperature, $$\text{cycle 2 to 100} = \min_n T(n)$$

Temperature integral, $$\text{cycle 2 to 100} = \int_{t_2}^{t_{100}} T(t)dt$$

Internal resistance, cycle 2=IR(n=2)
Minimum internal $$\text{resistance} = \min_n IR(n)$$

Internal resistance, cycle 100-cycle 2=IR(n=100)−IR(n=2)

It is interesting to note that $\Delta Q(V)$ can be related to the change in energy of the battery over cycles. For a battery galvanostatically cycled between $V_1$ and $V_2$, the energy is given by $$E = \int_{V_1}^{V_2} Q(V)dV$$

A change in energy, $\Delta E$, is given by $$\Delta E = \int_{V_1}^{V_2} Q_{100}(V)dV - \int_{V_1}^{V_2} Q_{10}(V)dV = \int_{V_1}^{V_2}(Q_{100}(V) - Q_{10}(V))dV$$

Various transformations of $\Delta Q(V)$ are correlated with a change in energy.

The features selected in our three models are presented in Table 3.

TABLE 3

Features considered for the various model implementations. The simplest model uses only the log variance of $\Delta Q100\text{-}10(V)$ and does not consider model selection. More complex models are considered using only discharge information (first two sections) as well as additional measurements (all sections).

|  | Features | "Variance" | "Discharge" | "Full" |
|---|---|---|---|---|
| $\Delta Q_{100-10}(V)$ features | Minimum |  | ✓ | ✓ |
|  | Mean |  |  |  |
|  | Variance | ✓ | ✓ | ✓ |
|  | Skewness |  | ✓ |  |
|  | Kurtosis |  | ✓ |  |
|  | Value at 2 V |  |  |  |
| Discharge capacity fade curve features | Slope of the linear fit to the capacity fade curve, cycles 2 to 100 |  |  | ✓ |
|  | Intercept of the linear fit to capacity fade curve, cycles 2 to 100 |  |  | ✓ |
|  | Slope of the linear fit to the capacity fade curve, cycles 91 to 100 |  |  |  |
|  | Intercept of the linear fit to capacity fade curve, cycles 91 to 100 |  |  |  |
|  | Discharge capacity, cycle 2 |  | ✓ | ✓ |
|  | Difference between max discharge capacity and cycle 2 discharge capacity, cycle 100 |  | ✓ |  |
| Other features | Average charge time, first 5 cycles |  |  | ✓ |
|  | Maximum temperature, cycles 2 to 100 |  |  |  |
|  | Minimum temperature, cycles 2 to 100 |  |  |  |
|  | Integral of temperature over time, cycles 2 to 100 |  |  | ✓ |
|  | Internal resistance, cycle 2 |  |  |  |
|  | Minimum internal resistance, cycles 2 to 100 |  |  | ✓ |
|  | Internal resistance, difference between cycle 100 and cycle 2 |  |  | ✓ |

The features and model coefficients used in the full model are displayed in FIG. 8.

Four naïve models were considered for benchmarking:

1. "Constant": using the average cycle life of the training set for all predictions
2. "Discharge at cycle 100": univariate model using only the discharge capacity at cycle 100
3. "Slope of discharge cycles 91-100": univariate model using only the slope of the linear fit for discharge capacity, cycles 91-100
4. "Multivariate discharge model": multivariate model with feature selection using the features described in Table 4 (note that these features are the second section of Table 3)

TABLE 4

The six features selected in the Q(n) only model.

| | Features | "Capacity fade curve" |
|---|---|---|
| Discharge capacity fade curve features | Slope of capacity fade curve, cycles 2 to 100 | ✓ |
| | Intercept of the linear fit to capacity fade curve, cycles 2 to 100 | ✓ |
| | Slope of capacity fade curve, cycles 91 to 100 | ✓ |
| | Intercept of the linear fit to the capacity fade curve, cycles 91 to 100 | |
| | Discharge capacity, cycle 2 | ✓ |
| | Max discharge capacity-discharge capacity, cycle 2 | ✓ |
| | Discharge capacity, cycle 100 | ✓ |

Figure 9:
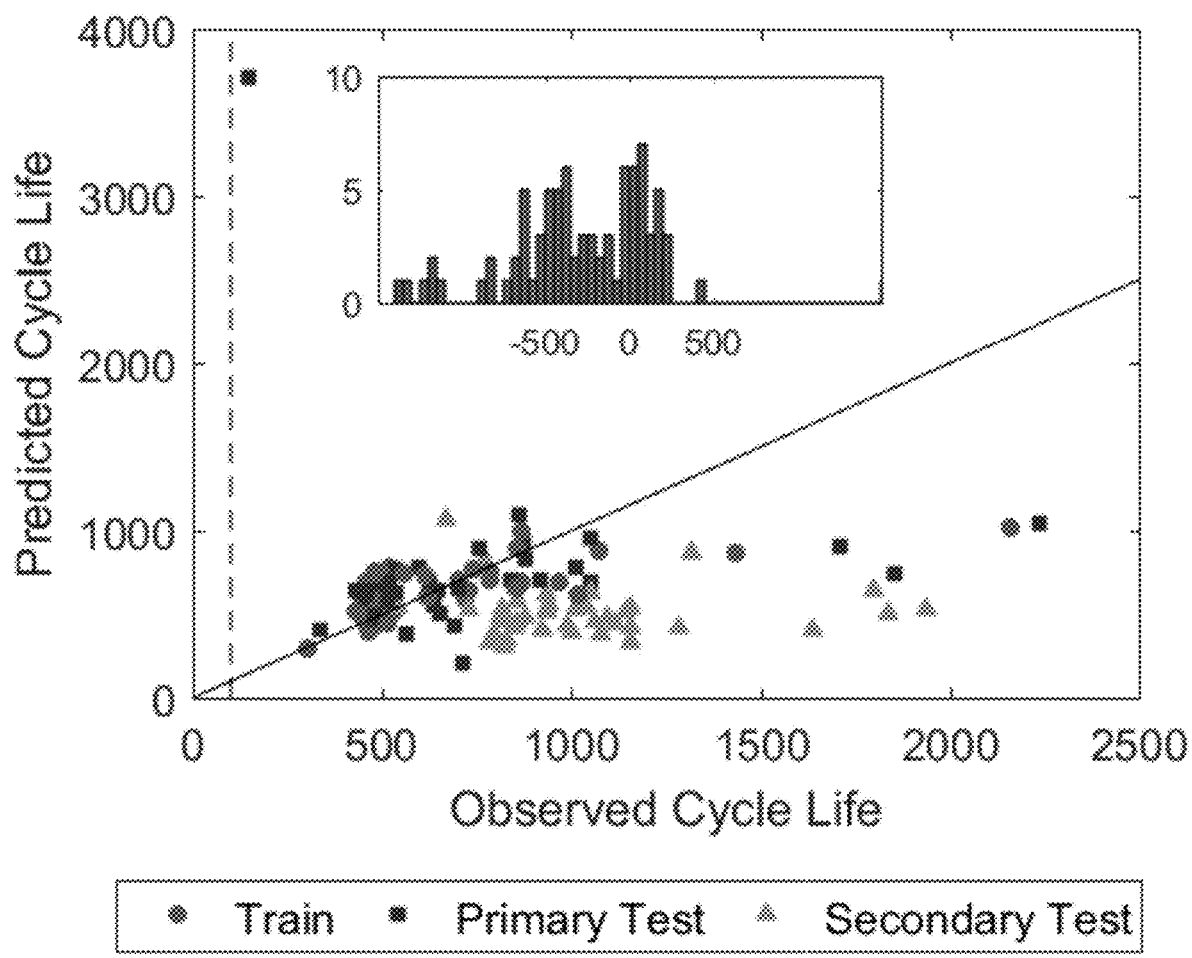
FIG. 9 shows observed and predicted cycle lives for the "capacity fade curve" model. The training data are used to learn the model structure and coefficient values. The testing data are used to assess generalizability of the model. The vertical dotted line indicates when the prediction is made in relation to the observed cycle life. The features used in the model can be found in Table 4. The inset shows the histogram of residuals (predicted—observed) for the primary and secondary test data, according to the current invention. The residual for the outlier battery is not shown.

In all analyses, the same data partitioning into train, primary test, and secondary test is used. The resulting best model is shown in FIG. 9, and all errors are reported in Table 5.

TABLE 5

The six features selected in the "capacity fade curve" model.

| | Features | "Capacity fade curve" |
|---|---|---|
| Discharge capacity fade curve features | Slope of capacity fade curve, cycles 2 to 100 | ✓ |
| | Intercept of the linear fit to capacity fade curve, cycles 2 to 100 | ✓ |
| | Slope of capacity fade curve, cycles 91 to 100 | ✓ |
| | Intercept of the linear fit to the capacity fade curve, cycles 91 to 100 | |
| | Discharge capacity, cycle 2 | ✓ |
| | Max discharge capacity-discharge capacity, cycle 2 | ✓ |
| | Discharge capacity, cycle 100 | ✓ |

TABLE 5

Model metrics for the benchmark models. Train and test refer to the data used to learn the model and evaluate model performance, respectively. One battery in the test set reaches 80% SOH rapidly and does not match other observed patterns. Therefore, the parenthetical test results correspond to the exclusion of this battery.

| | RMSE (cycles) | | | Mean Percent Error | | |
|---|---|---|---|---|---|---|
| | Train | Primary Test | Secondary Test | Train | Primary Test | Secondary Test |
| "Constant" model | 327 | 401 (399) | 511 | 29.6% | 34.9% (28.2%) | 36.1% |
| "Discharge at cycle 100" model | 304 | 373 (378) | 577 | 25.0% | 26.4% (24.7%) | 45.3% |
| "Slope of discharge 91-100" model | 307 | 370 (374) | 488 | 25.1% | 26.1% (25.7%) | 33.7% |
| "Capacity fade curve" model | 243 | 629 (323) | 624 | 18.8% | 78.5% (23.1%) | 50.0% |

Using only capacity fade curve features does not capture the cycle life well, especially for batteries with long cycle lives. The errors of all benchmarking models are significantly larger than those presented in the main text.

Figure 10:
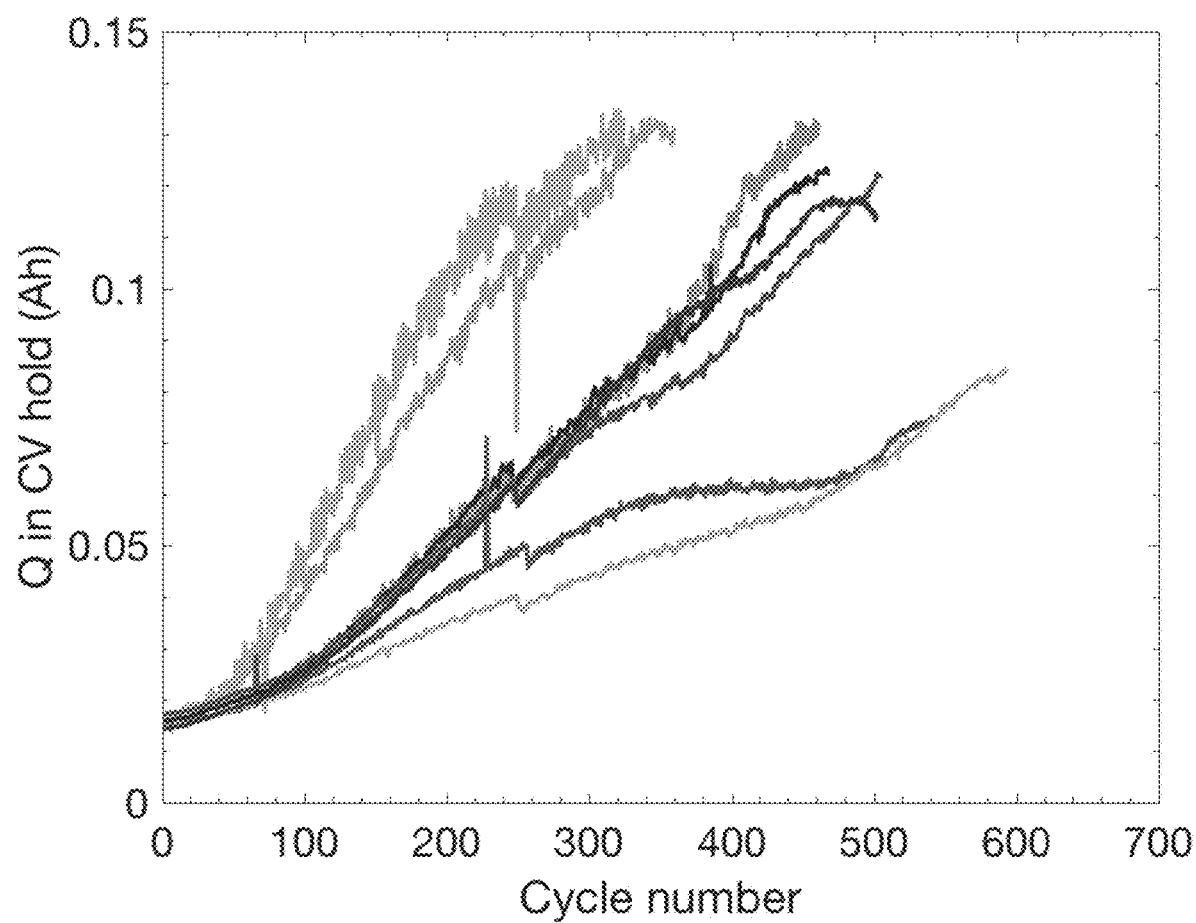
FIG. 10 shows measured capacity during the constant-voltage hold at the end of discharge as a function of cycle number for four representative cells. The lower cutoff potential is 2V, and the current cutoff condition is C/50, according to the current invention.

The role of kinetic degradation is considered in the system by investigating the capacity discharged during the constant-voltage hold, which is an accessible metric of kinetic degradation. In fact, a continuous increase in this capacity with cycle number was observed (FIG. 10), which is one indication that the impedance is increasing with time. However, because LAM causes an increase in the local current density and thus the impedance, distinguish between a true impedance increase from interfacial/interphasial effects and an effective increase is not possible due to LAM.

The change in discharge energy between representative slow (C/10) cycles and fast (4 C) cycles within each of the three charging conditions is displayed in Table 6 (comparison between cycle ~100 and beginning of life) and Table 7 (comparison between end of life and beginning of life). The ratio between the change in energy between slow cycling and fast cycling provides one measure of the contributions from OCV degradation modes such as LAM. Generally, the change in energy during slow discharging is 50%-80% of the total change in energy during high-rate discharging.

TABLE 6

Comparison of the change in discharge energy between cycle ~100 and the beginning of life for slow (C/10) diagnostic cycling and fast (4 C) standard cycling.

| Charging rate | Slow cycling: Cycle 100-cycle 1 (Wh) | Fast cycling: Cycle 101-cycle 10 (Wh) | Slow cycling/Fast cycling (%) |
|---|---|---|---|
| 4 C | −0.0247 | 0.0182 | −136% |
| 6 C | 0.0357 | 0.0678 | 52.7% |
| 8 C | 0.0841 | 0.1269 | 66.3% |

TABLE 7

Comparison of the change in discharge energy between the end of life and the beginning of life for slow (C/10) diagnostic cycling and fast (4 C) standard cycling.

| Charging rate | Slow cycling: Final cycle-cycle 1 (Wh) | Fast cycling: $2^{nd}$-to-last cycle-cycle 10 (Wh) | Slow cycling/Fast cycling (%) |
|---|---|---|---|
| 4 C | 0.2312 | 0.2811 | 82.2% |
| 6 C | 0.2226 | 0.3838 | 58.0% |
| 8 C | 0.2410 | 0.4042 | 59.6% |

Figure 11:
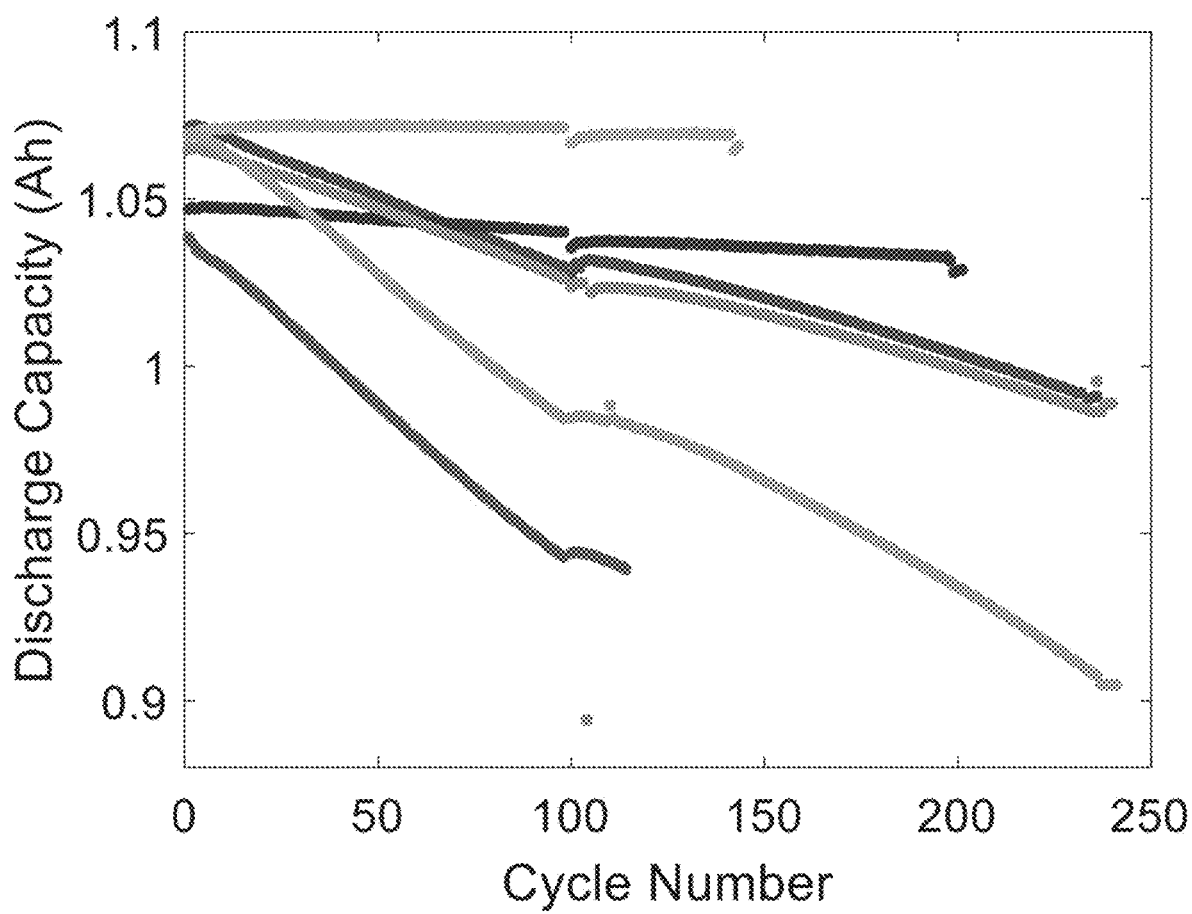
FIG. 11 shows discharge capacity curves for batteries with periodic slow charging. A slow (C/10) charge and discharge cycle is employed at cycle 100, resulting in an increase in discharge capacity on subsequent cycles, according to the current invention.

For diagnostic cycling, the brief rise in discharge capacity after diagnostic cycling is illustrated in FIG. 11.

For relative indexing schemes. throughout this disclosure, $\Delta Q(V)$ is defined based on fixed indices, e.g. $\Delta Q(V)=Q_{100}(V)-Q_{10}(V)$, irrespective of battery performance. Additional analysis was performed to compare this fixed indexing scheme to relative indexing schemes. In the relative indexing paradigm, indices are chosen based on the relative capacity decrease. There are three primary choices for the baseline capacity: the nominal capacity of the cell reported by the manufacturer, the initial capacity of the cell, or the maximum capacity of the cell. The nominal capacity of the cells used in analysis is 1.1 Ah. Many cells never reached this capacity, meaning it is not a useful baseline. Most of the cells experience an initial increase in capacity, which, if used for scaling, shifts the cycle at which the first decrease is observed. This leaves the maximum as the best option for a capacity benchmark.

Figure 12B:
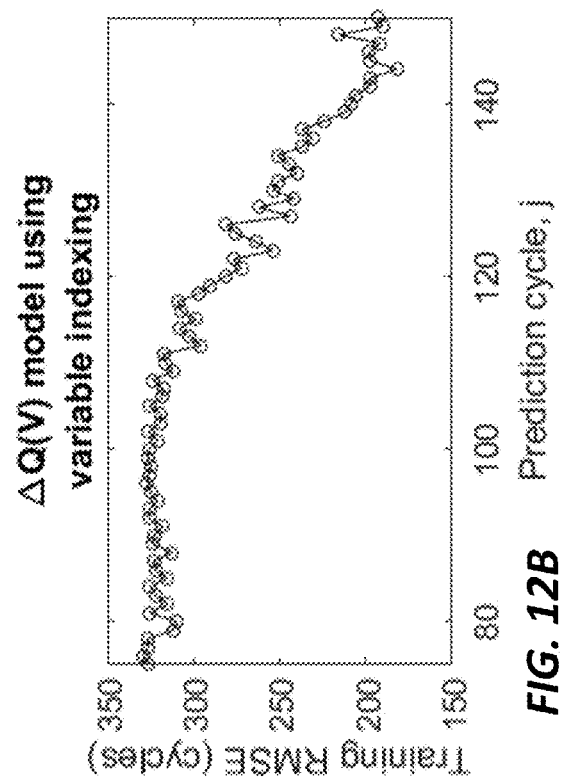
FIGS. 12A-12C show Results of an alternate indexing scheme for the $\Delta Q(V)$ features. (12A) The early index is determined based on the maximum achieved capacity index, $h_i$, indicated for each battery, i, by a black x. The $\Delta Q(V)$ is then calculated as $Q_k(V) - Q_{h_i}(V)$ where $$k = j + h_i - \max_i h_i$$
Figure 12C:
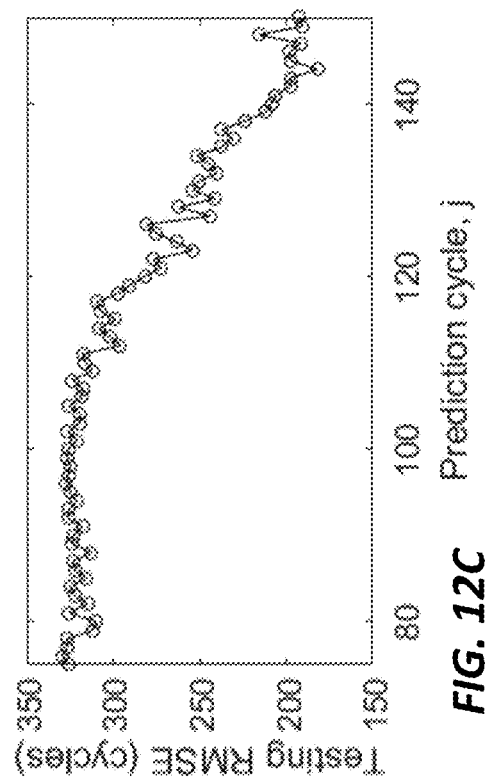
Figure 12A:
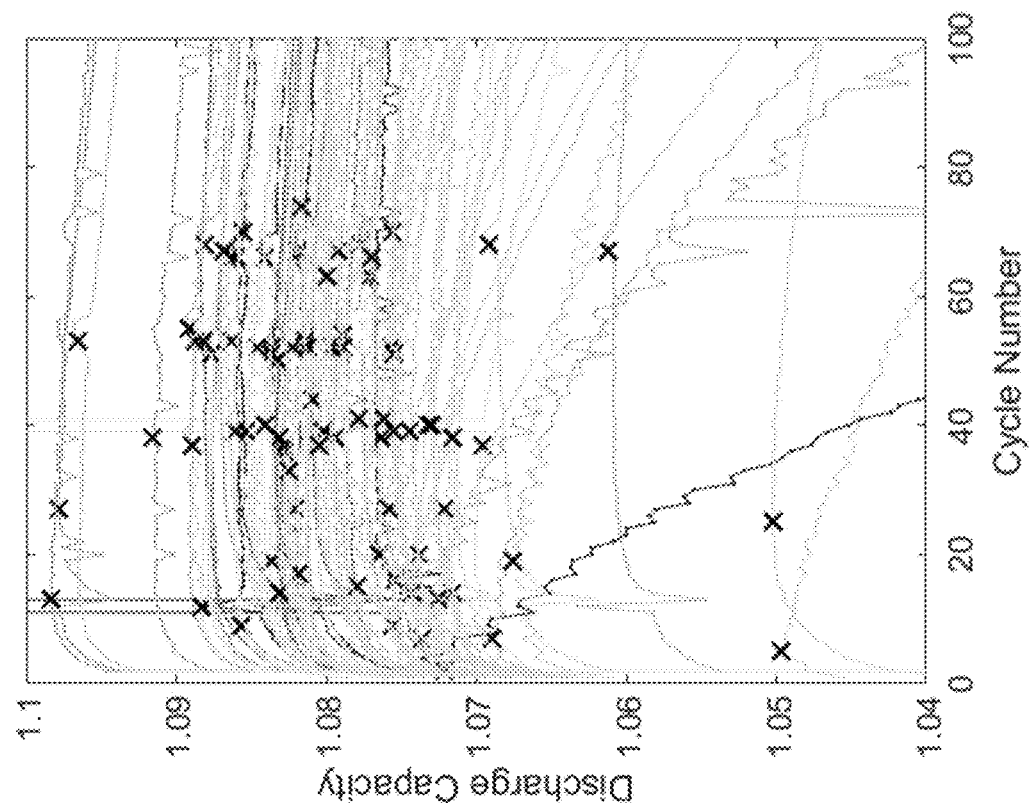

Two possible indexing schemes using the capacity scaled by its maximum value were investigated. In the first scheme, a fixed number of cycles after the maximum was used. The results of this procedure are shown in FIGS. 12A-12C. The errors of the resulting models do decrease in a similar pattern to FIG. 5; however, the improvements in predictive power take longer to develop and do not go as low as observed in the fixed indexing scheme.

Figure 13:
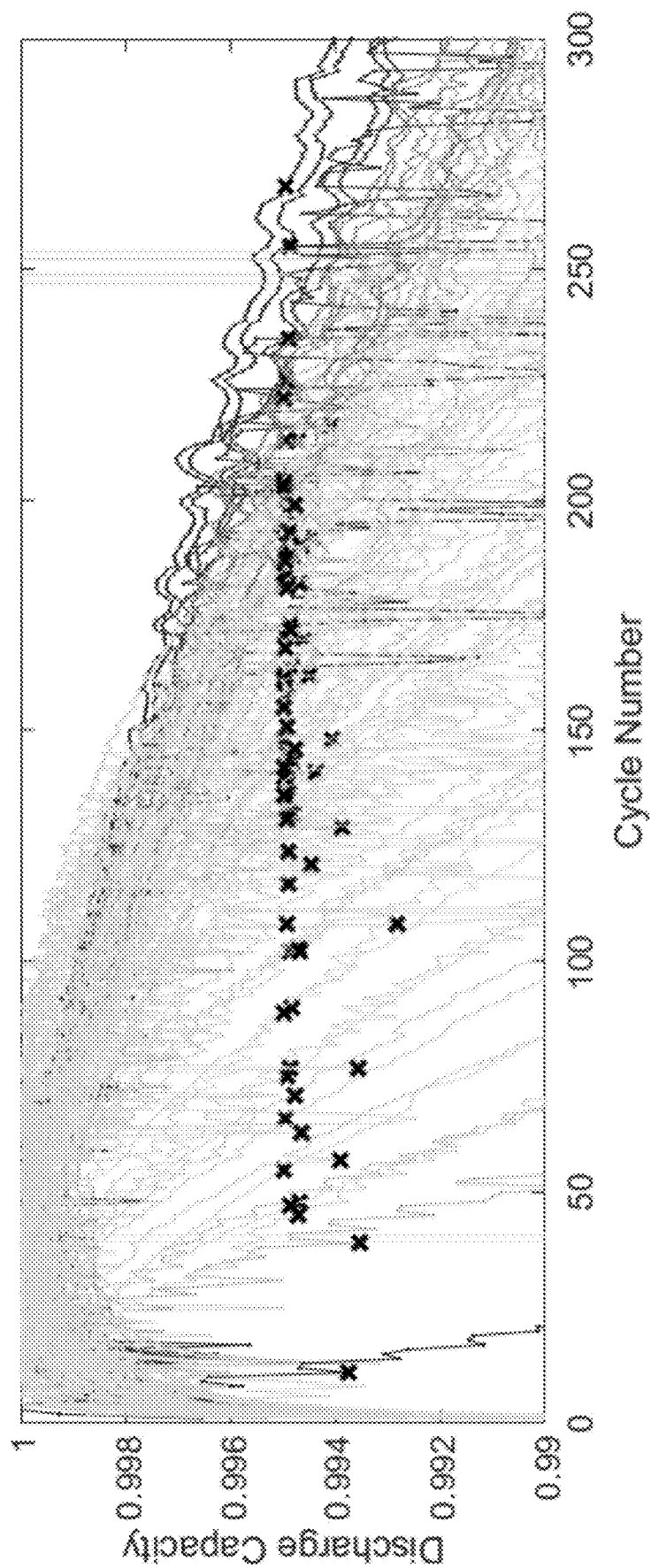
FIG. 13 shows an example of the selection of indices for applying the $\Delta Q(V)$ features using the relative discharge capacity curves. Each discharge capacity is scaled by the maximum discharge capacity value (shown in FIG. 12A). Each x indicate a cycle corresponding to a relative discharge capacity of 0.995, according to the current invention.

The second indexing scheme considers choosing each of the indices based on when a particular relative capacity fade is achieved. FIG. 13 shows an example of the scaled capacity curves as well as the selection of the cycle corresponding to a relative capacity of 0.995. For all cells in the dataset, more than 250 cycles have passed before 99.5% capacity fade is reached. Therefore, this type of indexing scheme clearly delays when predictions can be made. The errors for the resulting models are shown in FIG. 14. The grey colorbar is set to match FIG. 5. A comparison of these two figures shows that the relative indexing scheme models have higher error than the fixed indexing scheme models.

Initially, this result may seem surprising. However, the relative indexing scheme has the effect of collapsing the trend that differentiates the cells by rescaling. Therefore, fixed indexing schemes are better suited to this prediction task.

Figure 15A:
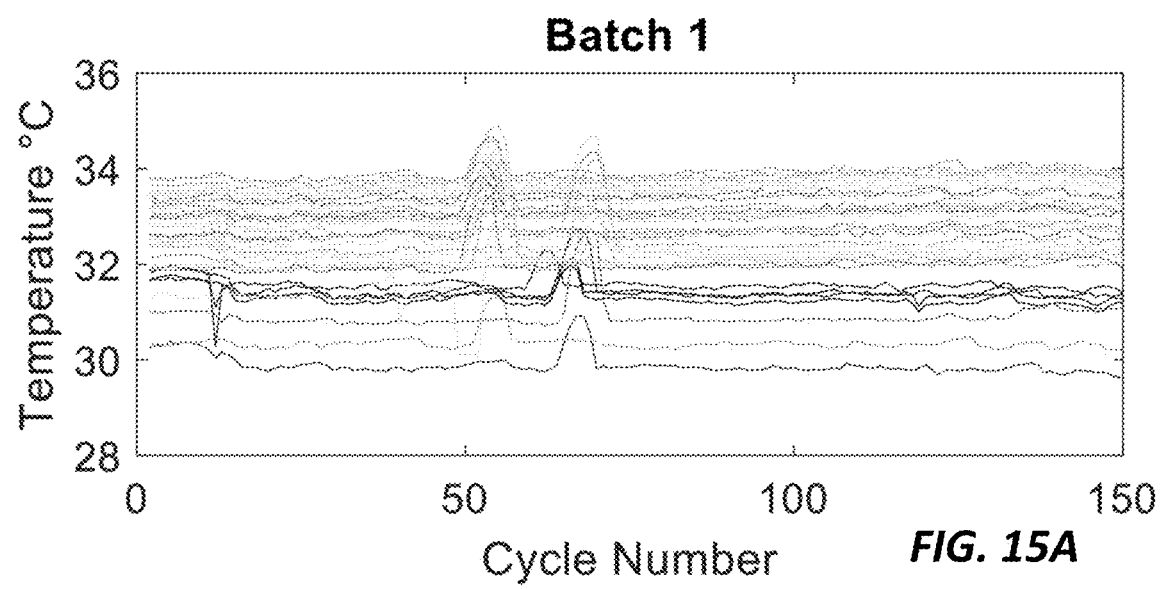
FIGS. 15A-15B shows the average temperature for each of the batteries over the first 150 cycles. The spike in temperature observed in batch 1 corresponds to the decrease in performance observed in FIG. 5, according to the current invention.
Figure 16:
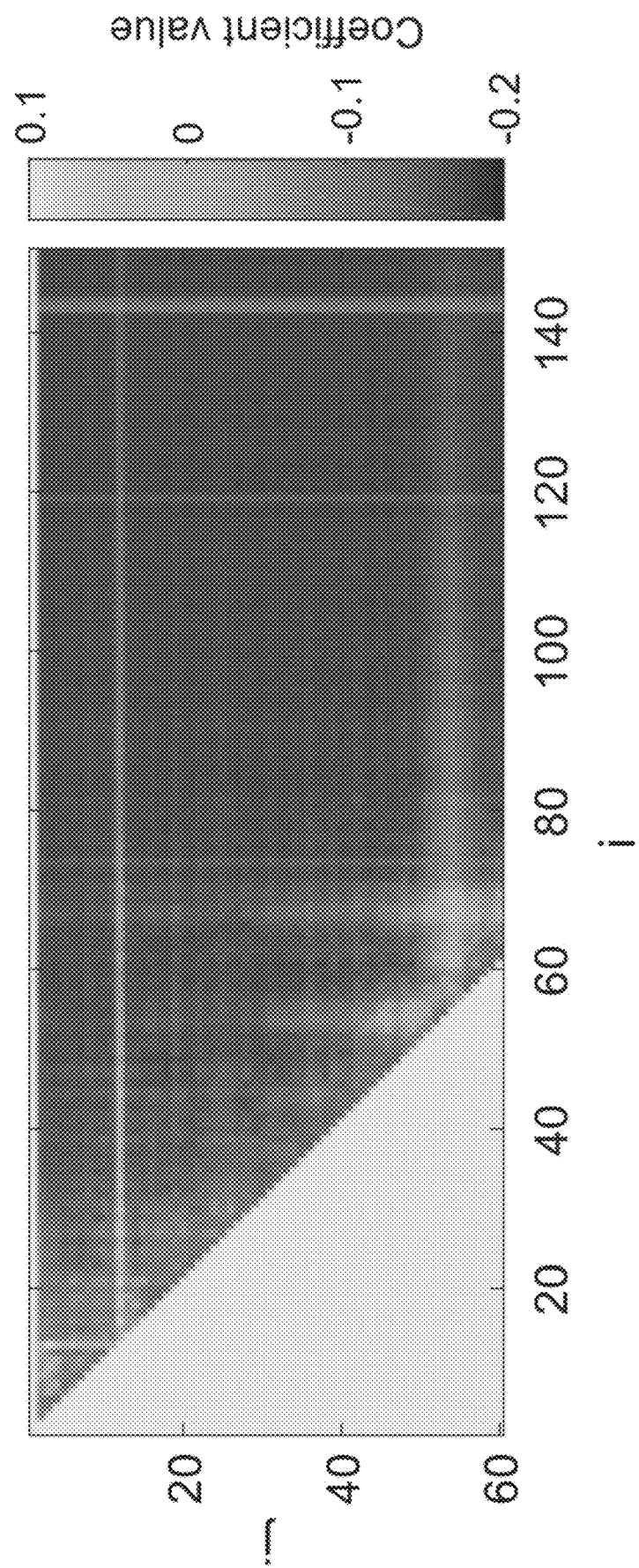
FIG. 16 shows the value of the coefficients corresponding to the results in FIG. 5. The model is $\hat{y}_k = wx_k + b$, where $\hat{y}_k$ is the predicted cycle life for battery k, $x_k$ is the ΔQ(V) feature for battery k, w is the coefficient, and b is an offset term, according to the current invention.
Figures 17A, 17B:
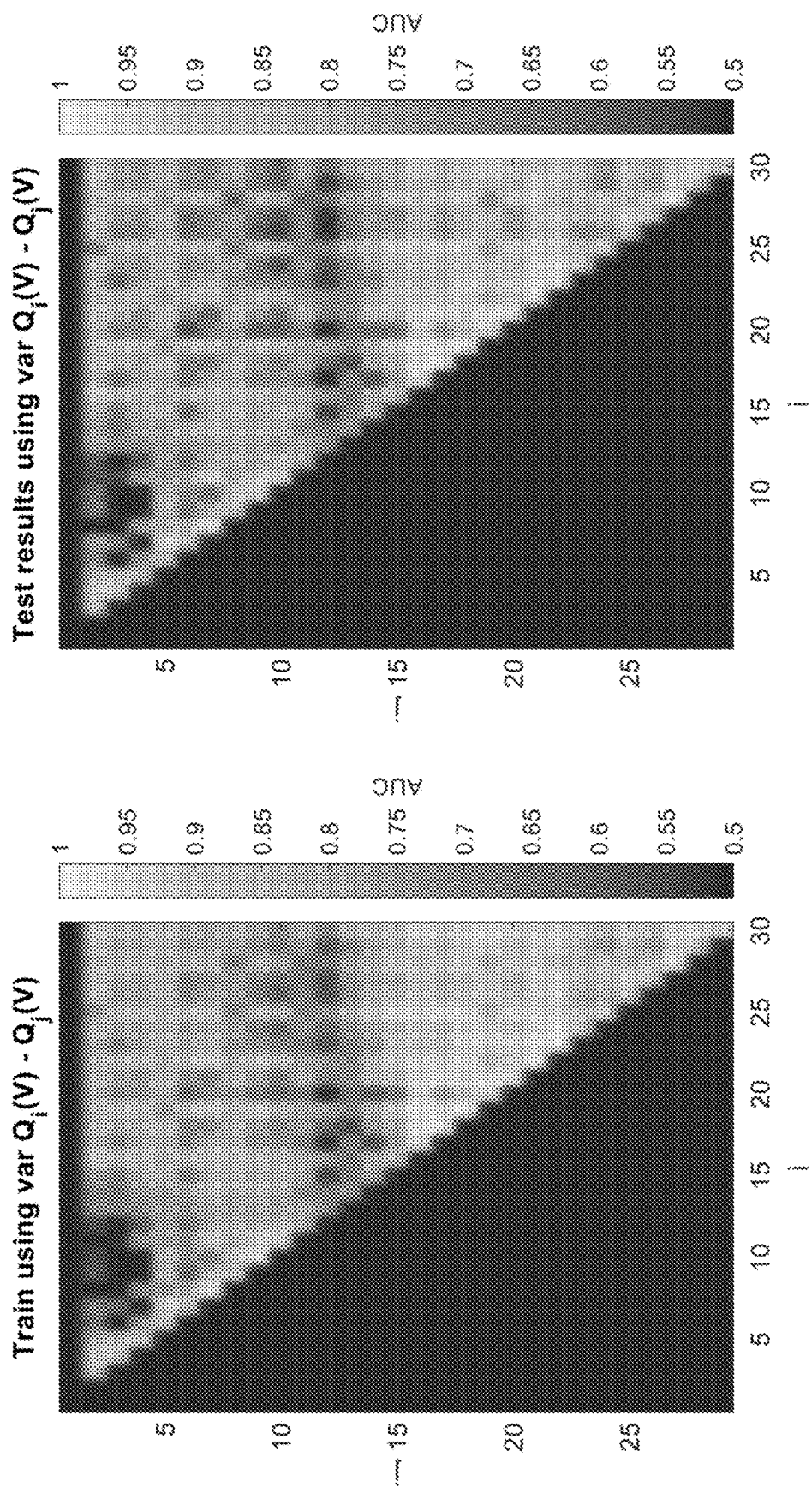
FIGS. 17A-17B show average AUC for 20 random train/test splits using a lifetime threshold of 550 cycles, according to the current invention.
Figures 18A, 18B:
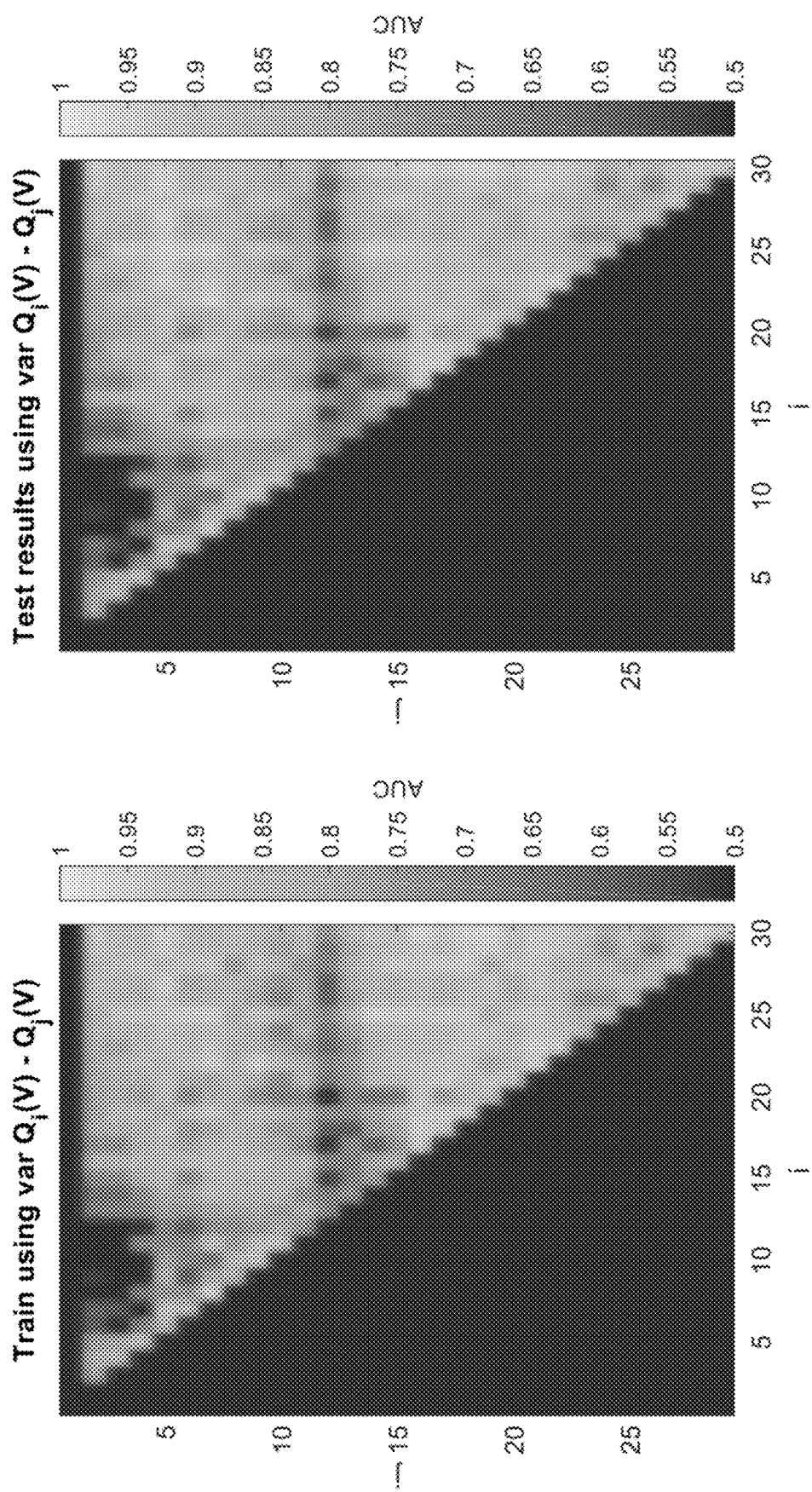
FIGS. 18A-18B show average AUC for 20 random train/test splits using a lifetime threshold of 700 cycles, according to the current invention.

Regarding the experimental temperature fluctuations, during one run of our cycling experiment ("batch1"), the temperature chamber experienced two brief increases in temperature (FIG. 15A). This impacted approximately 50% of the cells in the test and train datasets. This effect is likely responsible for the high-error regions in FIG. 5 for i=60 through i=70. The temperature remained constant during the subsequent run ("batch2"), which included the other 50% of the cells in the train and test datasets. The values of the coefficients as a function of cycle indices, mapping to the $\Delta Q(V)$ feature in FIG. 5, are displayed in FIG. 16.

Turning now to early-cycle classification, two types of classification analysis were performed using two thresholds. The first analysis uses only the log variance of $\Delta Q(V)$ to classify batteries as "low lifetime" or "high lifetime". The data are evenly split into train and test groups of 42 cells using the same train-test split as before, analogously to FIG. 5. Test data are scaled based on the training data. The area under the receiver operator curve (AUC) is then calculated. AUC is a common metric for classification tasks and is a measure of the area under the true positive rate—false positive rate tradeoff curve. An AUC of 0.5 is equivalent to a random classification, and an AUC of unity is perfect separation. 20 bootstrap samples of train/test splits and average the AUC across these trials were performed. The results are shown in FIGS. 17A-17B and FIGS. 18A-28B for lifetime thresholds of 550 and 700, respectively.

Figure 15B:
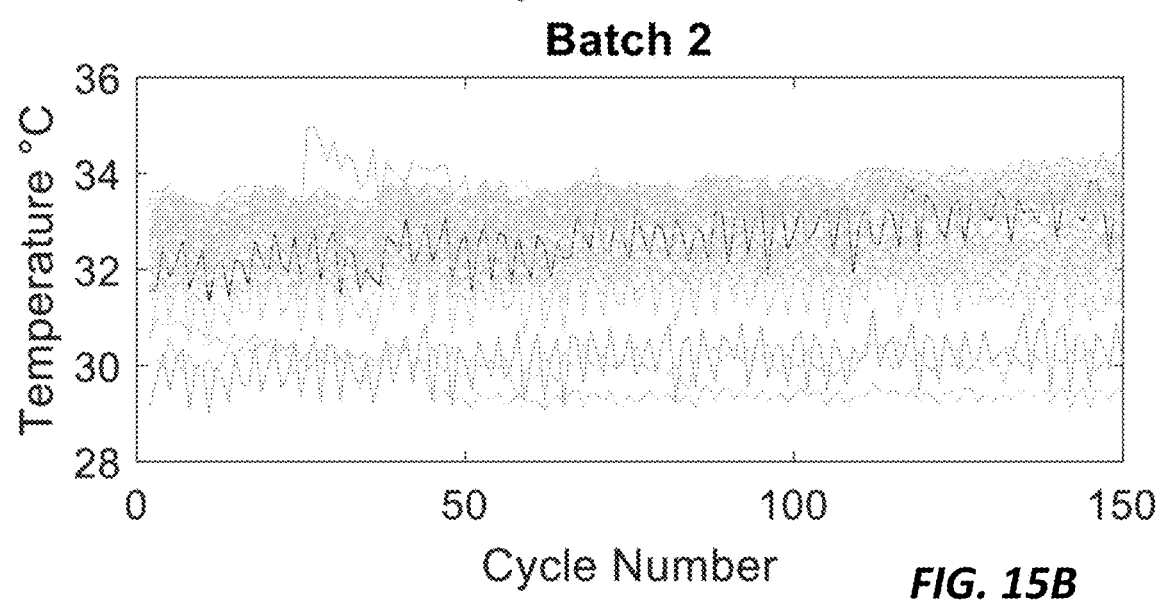

For early cycles (i, j<10), the performance is highest along the i=j+1 diagonal. This trend is seen for both threshold values. This observation is rationalized by considering temperature fluctuations within the chamber (see FIGS. 15A-15B). Given the temperature fluctuations on the scale of five cycles, it is hypothesize that consecutive cycles are highly performing in these early-cycle contexts because their temperatures are most similar. This effect is less important for predictions with higher degradation, as the effect of degradation supersedes the effect of temperature fluctuations. This result highlights the importance of stable temperature control for these factory-based applications.

Figure 3A:
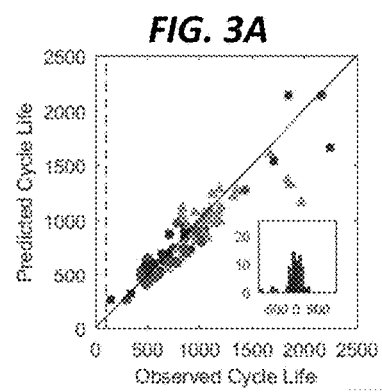
FIGS. 3A-3C show observed and predicted cycle lives for several implementations of the feature-based model. The training data are used to learn the model structure and coefficient values. The testing data are used to assess generalizability of the model. The primary test and secondary test datasets are differentiated because the latter was generated after model development. The vertical dotted line indicates when the prediction is made in relation to the observed cycle life. The inset shows the histogram of residuals (predicted—observed) for the primary and secondary test data. (3A), "variance" model using only the log variance of $\Delta Q_{100-10}(V)$. (3B), "discharge" model using six features based only on discharge cycle information, described in Table 2. (3C), "full" model using the nine features described in Table 2. Because some temperature probes lost contact during experimentation, four cells are excluded from the full model analysis.
Figure 3B:
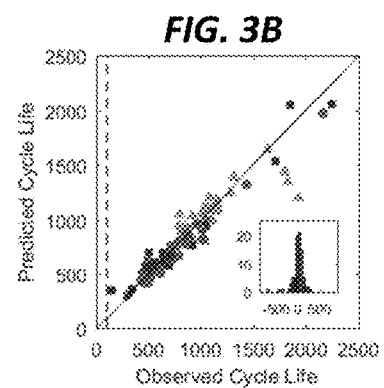
Figure 3C:
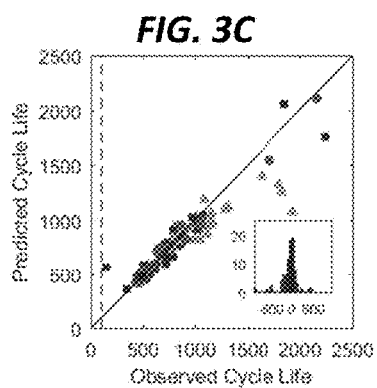

The second analysis looks at model building is the same manner as FIGS. 3A-3C in a classification setting, using features from only the first five cycles. A logistic regression model was developed to classify batteries into "low lifetime" and "high lifetime" classes, selecting 550 cycles as the lifetime threshold. In logistic regression, the logic function is employed to estimate probabilities of an event. The values of probability range from 0 to 1. The logistic loss criterion was used with l1-regularization to train the model and perform subset selection simultaneously, similar to the regularized linear model presented previously.

First, a model using only the variance of $\Delta Q(V)=Q_5(V)-Q_4(V)$ and no subset selection is learned. This model is termed "variance classifier". These indices were selected based on restricting the prediction to be in the first five cycles as well as the analysis presented in FIGS. 15A-15B and FIG. 16. The coefficient weight of the trained model is −0.433. 16 of 120 points are incorrectly classified, highlighting our high performance even at very early cycles. Accuracy information is also presented in Table 8 using the confusion matrix. A confusion matrix is a standard representation of the classification accuracy for each class.

Figure 19:
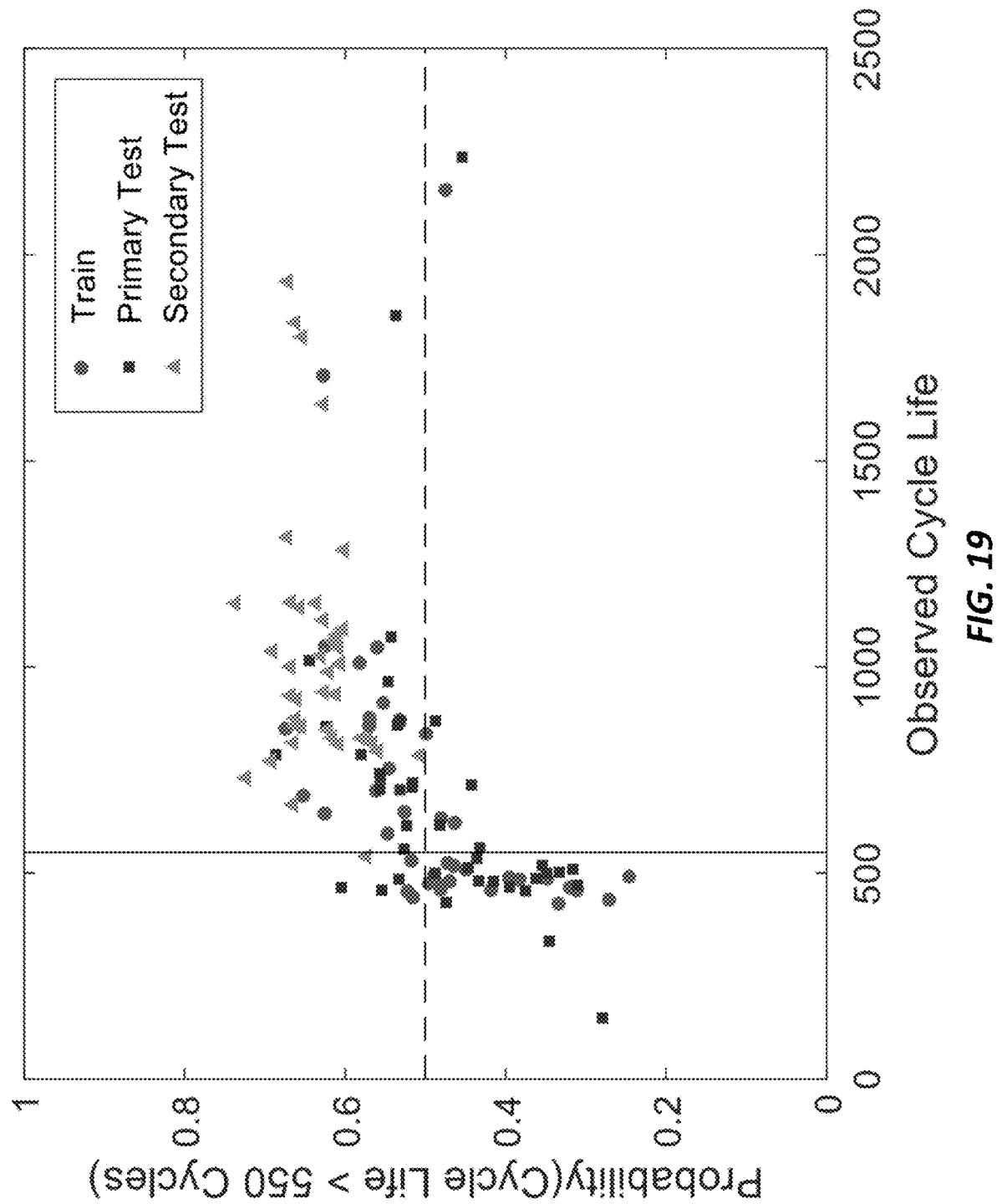
FIG. 19 shows the probability of a battery's lifetime exceeding the lifetime threshold of 550 cycles vs observed cycle life using the "variance classifier". The decision boundary is 0.5. Variance of $\Delta Q(V) = Q_5(V) - Q_4(V)$ is the only feature in the classification model, according to the current invention.

FIG. 19 presents the probability of the cycle life exceeding 550 cycles (in other words, the probability a battery is in the "high lifetime" class) using the "variance classifier". In this figure, points within the bottom left and top right quadrants are correctly classified, while points within the bottom right and top left quadrants are incorrectly classified. A probability of 0.5 was selected as the decision boundary.

TABLE 8

Confusion matrix for the classification task with the "variance classifier" using a maximum cycle number of 5 and a lifetime threshold of 550. The values in the addition expressions are for train, primary test, and secondary test, respectively. The accuracies are 82.1%, 78.6%, and 97.5% for train, primary test, and secondary test, respectively. There are 39, 41, and 40 cells in the three groups, respectively.

| Observed/Predicted | High lifetime | Low lifetime | Total |
|---|---|---|---|
| High lifetime | 15 + 20 + 39 = 74 | 3 + 3 + 0 = 6 | 80 |
| Low lifetime | 4 + 5 + 1 = 10 | 16 + 14 + 0 = 30 | 40 |
| Total | 84 | 36 | 120 |

A second model, "full classifier", is also built with subset selection. Eighteen of the twenty features from the full model (Table 1) are candidate features; however, these features are edited to only draw information up to cycle 5. The late-cycle slope and intercept (slope and intercept for a linear fit between cycles 91 and 100) did not have an analogue in this setting, which removed two of the twenty features. Again, cycles 5 and 4 are used for $\Delta Q(V)$. The selected features and their weights are presented in Table 9 for a threshold of 550 cycles.

TABLE 9

Selected features in l1-regularized logistic regression in the "full classifier". Four of eighteen features were selected.

| Feature | Weight |
|---|---|
| Temperature integral | −1.180 |
| Charge time | 0.710 |
| min ($\Delta Q_{5-4}(V)$) | −0.522 |
| var ($\Delta Q_{5-4}(V)$) | −0.462 |

It is found that the temperature integral is the most highly weighted feature, in line with the previous rationalization of the importance of temperature in very-early-cycle prediction tasks. Two $\Delta Q_{5-4}(V)$ features, the minimum and the variance, were selected, further showcasing the predictive power of this feature.

Figure 20:
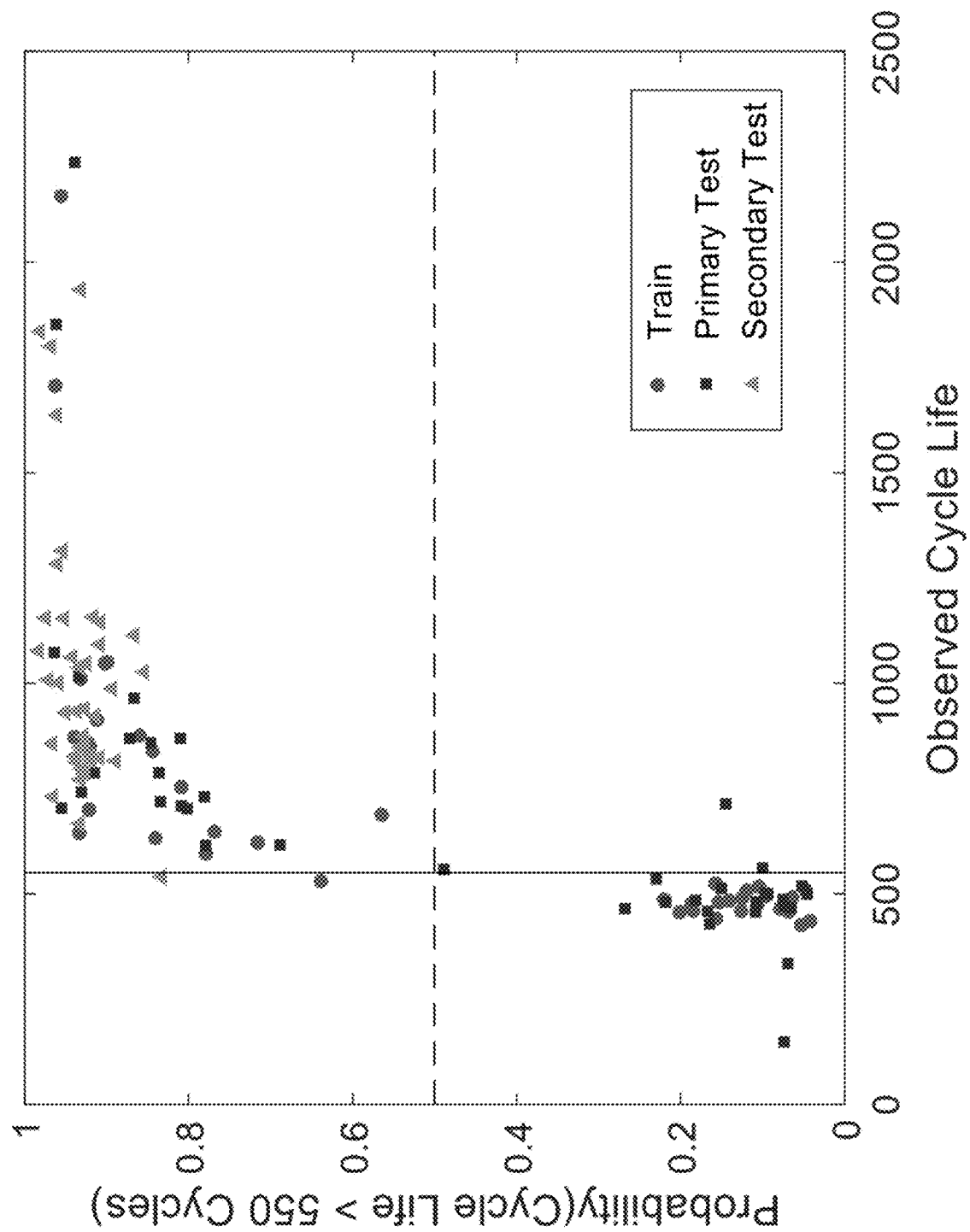
FIG. 20 shows the probability of a battery's lifetime exceeding the lifetime threshold of 550 cycles vs observed cycle life using the "variance classifier". The decision boundary is 0.5. Five cycles were used in this classification task, according to the current invention.

FIG. 20 presents the probability of the cycle life exceeding 550 cycles (in other words, the probability a battery is in the "high lifetime" class) for the "full classifier". This figure should be read in a similar manner as FIG. 19. Again, a probability of 0.5 was selected as the decision boundary.

Five of 120 points are incorrectly classified, highlighting the high performance even at very early cycles. This information is also presented in Table 10, the confusion matrix.

TABLE 10

Confusion matrix for the classification task using the "full classifier" using a maximum cycle number of 5 and a lifetime threshold of 550. The values in the addition expressions are for train, primary test, and secondary test, respectively. The accuracies are 97.4%, 92.7%, and 97.5% for train, primary test, and secondary test, respectively. There are 39, 41, and 40 cells in the three groups, respectively.

| Observed/Predicted | High lifetime | Low lifetime | Total |
|---|---|---|---|
| High lifetime | 18 + 19 + 39 = 77 | 0 + 3 + 0 = 3 | 80 |
| Low lifetime | 1 + 0 + 1 = 2 | 19 + 19 + 0 = 38 | 40 |
| Total | 79 | 41 | 120 |

Four cells had unexpectedly high measurement noise and were excluded from analysis. The rate capability during charge and discharge of the A123 18650 M1A cells is presented in FIGS. 21A-21B. The goodness of fit of the smoothing spline is illustrated in FIGS. 22A-22B.

Figure 23:
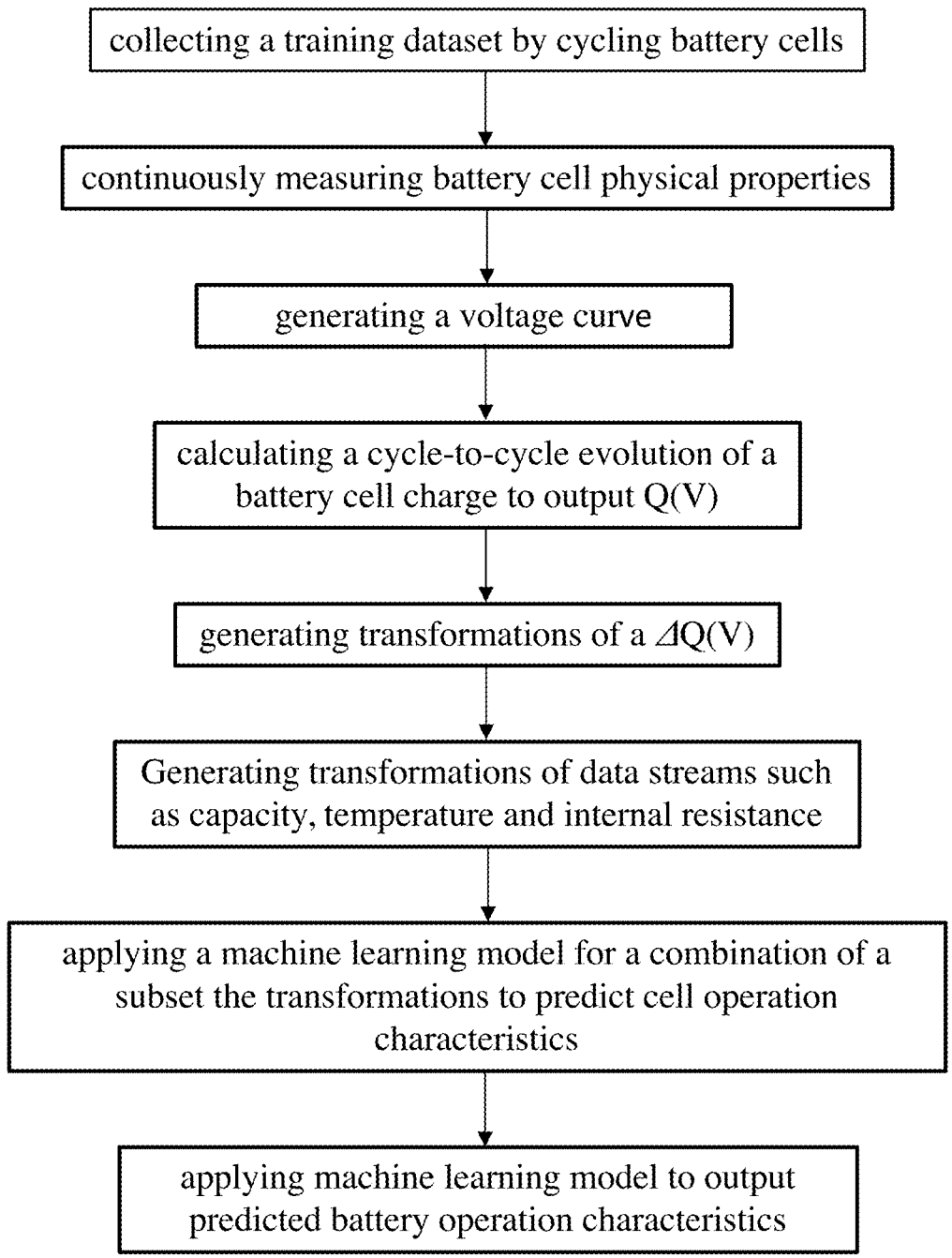
FIG. 23 shows a flow diagram of one embodiment of the current invention.

FIG. 23 shows a flow diagram of one embodiment of the current invention.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, data streams such as strain and impedance spectroscopy could be used as input to the prediction algorithm; calendar life, energy and power output could be the output of the prediction algorithm. With regards to the algorithm, implementations may include non-linear, unsupervised feature selection, etc.

All such variations are considered to be within the scope and spirit of the present invention to as defined by the following claims and their legal equivalents.

What is claimed:

1. A method of collecting battery data suitable for use in data-driven predictive modeling to predict battery cell performance, the method comprising:
   a) collecting a dataset by cycling, using a battery cycling instrument in a laboratory, a plurality of battery cells between a voltage V1 and a voltage V2;
   b) continuously measuring one or more battery cell physical properties during said cycling;
   c) measuring a charge-voltage curve Q(V) for each said battery cell during said cycling;
   d) calculating, using data from said charge-voltage curves, a cycle-to-cycle evolution curve $\Delta Q(V)$ of a battery cell charge, wherein $\Delta Q(V)$ is a difference between charge-voltage curves Q(V) at two different cycles;
   e) automatically calculating one or more summary statistics of said $\Delta Q(V)$; and
   f) outputting the summary statistics.

2. The method according to claim 1, wherein said one or more battery cell physical properties are selected from the group consisting of: a battery cell voltage, a battery cell current, a battery cell can temperature, and a battery cell internal resistance.

3. The method according to claim 1, wherein said continuously measuring further comprises impedance spectroscopy and strain measurement.

4. A method of predicting one or more battery cell operation characteristics from battery cell cycling data, said method comprising:
   performing the method of claim 1 to collect said summary statistics of said $\Delta Q(V)$;
   training a machine learning model to relate one or more battery cell operation characteristics to said summary statistics of said $\Delta Q(V)$; and
   using the machine learning model, after said training, to predict one or more battery cell operation characteristics including battery lifetime from battery cell cycling data.

5. The method according to claim 4, wherein said battery cell operation characteristics are selected from the group consisting of: a battery lifetime, a logarithm of said battery lifetime, and a Boolean classification of battery performance.

6. The method according to claim 1, wherein said one or more battery cell physical properties include a battery cell internal resistance of each said battery cell.

7. The method of claim 1, wherein said one or more summary statistics are selected from the group consisting of: minimum, mean, variance, skewness and kurtosis.

* * * * *